United States Patent
Gallatin et al.

(10) Patent No.: US 7,512,927 B2
(45) Date of Patent: Mar. 31, 2009

(54) PRINTABILITY VERIFICATION BY PROGRESSIVE MODELING ACCURACY

(75) Inventors: Gregg M. Gallatin, Newtown, CT (US); Kafai Lai, Poughkeepsie, NY (US); Maharaj Mukherjee, Wappingers Falls, NY (US); Alan E. Rosenbluth, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 159 days.

(21) Appl. No.: 11/555,854

(22) Filed: Nov. 2, 2006

(65) Prior Publication Data

US 2008/0127027 A1 May 29, 2008

(51) Int. Cl.
*G06F 17/50* (2006.01)

(52) U.S. Cl. .................. 716/19; 716/4; 716/5; 716/20; 716/21; 430/5; 430/30

(58) Field of Classification Search ............. 716/19–21, 716/4–5; 430/5, 30
See application file for complete search history.

(56) References Cited

U.S. PATENT DOCUMENTS

| | | | |
|---|---|---|---|
| 5,965,306 A * | 10/1999 | Mansfield et al. ............. 430/22 |
| 6,249,904 B1 | 6/2001 | Cobb |
| 6,526,164 B1 * | 2/2003 | Mansfield et al. ........... 382/144 |
| 6,657,716 B1 | 12/2003 | Lensing et al. |
| 6,745,372 B2 | 6/2004 | Cote et al. |
| 7,350,183 B2 * | 3/2008 | Cui et al. ...................... 716/21 |
| 2002/0035461 A1 | 3/2002 | Chang et al. |
| 2002/0133801 A1 | 9/2002 | Granik et al. |
| 2002/0194576 A1 | 12/2002 | Toyama |
| 2004/0015787 A1 | 1/2004 | Heydler et al. |
| 2004/0019872 A1 | 1/2004 | Lippincott et al. |
| 2004/0044984 A1 | 3/2004 | Keogan et al. |
| 2004/0060034 A1 | 3/2004 | Cote et al. |
| 2004/0139420 A1 | 7/2004 | Brist et al. |
| 2004/0216065 A1 | 10/2004 | Cobb et al. |
| 2004/0221254 A1 | 11/2004 | Cobb et al. |
| 2004/0230930 A1 | 11/2004 | Lippincott et al. |
| 2005/0055658 A1 * | 3/2005 | Mukherjee et al. ............ 716/19 |
| 2005/0132310 A1 * | 6/2005 | Gallatin et al. ................. 716/4 |
| 2005/0283747 A1 | 12/2005 | Adam |
| 2006/0080633 A1 | 4/2006 | Hsu et al. |
| 2006/0126046 A1 | 6/2006 | Hansen |
| 2006/0195808 A1 | 8/2006 | Keck |

* cited by examiner

*Primary Examiner*—Vuthe Siek
*Assistant Examiner*—Nghia M Doan
(74) *Attorney, Agent, or Firm*—Todd M.C. Li

(57) ABSTRACT

A fast method of verifying a lithographic mask design is provided wherein catastrophic errors are identified by iteratively simulating and verifying images for the mask layout using progressively more accurate image models, including optical and resist models. Progressively accurate optical models include SOCS kernels that provide successively less influence. Corresponding resist models are constructed that may include only SOCS kernel terms corresponding to the optical model, or may include image trait terms of varying influence ranges. Errors associated with excessive light, such as bridging, side-lobe or SRAF printing errors, are preferably identified with bright field simulations, while errors associated with insufficient light, such as necking or line-end shortening overlay errors, are preferably identified with dark field simulations.

32 Claims, 21 Drawing Sheets

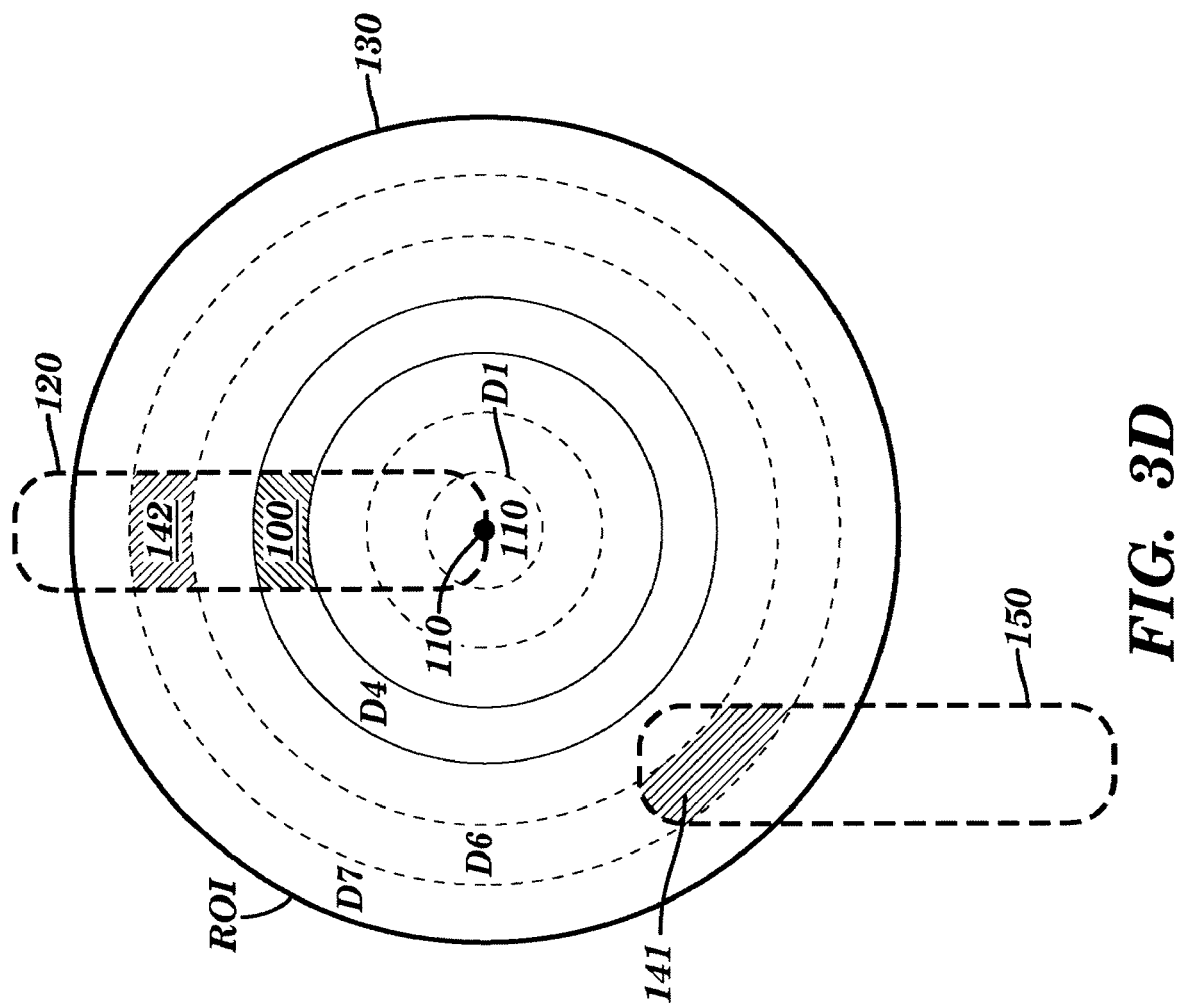

PRINTABILITY VERIFICATION BY PROGRESSIVE MODELING ACCURACY

BACKGROUND OF THE INVENTION

This invention relates generally to the field of optical lithography, and more particularly, to a method for verifying the accuracy of the results of an Model Based Optical Proximity Correction (MBOPC) software tool for use in an optical lithography simulation, to provide accurate correction of the device shapes in a photo-mask that fulfill required performance criteria for the resulting Very Large Scale Integrated (VLSI) circuit.

The optical micro-lithography process in semiconductor fabrication, also known as the photolithography process, consists of duplicating desired circuit patterns onto semiconductor wafers for an overall desired circuit performance. The desired circuit patterns are typically represented as opaque, complete and semi-transparent regions on a template commonly referred to as a photomask. In optical micro-lithography, patterns on the photo-mask template are projected onto the photo-resist coated wafer by way of optical imaging through an exposure system.

The continuous advancement of VLSI chip manufacturing technology to meet Moore's law of shrinking device dimensions in geometric progression has spurred the development of Resolution Enhancement Techniques (RET) and Optical Proximity Correction (OPC) methodologies in optical microlithography. The latter is the method of choice for chip manufacturers for the foreseeable future due to its high volume yield in manufacturing and past history of success. However, the ever shrinking device dimensions combined with the desire to enhance circuit performance in the deep sub-wavelength domain require complex OPC methodologies to ensure the fidelity of mask patterns on the printed wafer.

The ever increasing cost of mask manufacturing and inspection and the ever increasing complexity of OPC and RET require that the mask is correctly and accurately simulated for potential defects before the mask is manufactured. This area is generally known as Mask Manufacturability Verification or printability verification. Accurate simulation is the primary focus of Printability Verification. This means that the Printability Verification simulation should not miss any real error on the mask. The cost of finding the error when the mask is actually manufactured and is being used for chip manufacturing is extremely high. Nevertheless, there are two other equally important objectives of a Printability Verification tool. First it needs to be done as quickly as possible. The feedback from the Printability Verification is used for development of OPC and RET. A fast feedback is useful to minimize the Turn around Time (TAT) for OPC and RET developments. Second there should be as few false errors as possible. A false error is defined as error identified by Printability Verification using its simulation tool, which does not happen on the wafer. Since, a missed error is significantly more expensive than a false error, all printability verification tools are expected to err on the conservative side. However, since each error, whether false or real needs to be checked manually, it is important that there are not too many false errors either. If there are too many false errors, the real errors may be missed by the manual inspection and also it would require a lot of time to shift through all the false errors to find the real errors.

Optical models used in printability verification are typically the same optical models that may be used in model-based optical proximity correction (MBOPC). These approaches are in one form or another, related to the Sum of Coherent Source (SOCS) method, which is an algorithm for efficient calculation of the bilinear transform of the Hopkins integral, to be described in more detail below. The SOCS approximation of the Hopkins integral involves convolution of Hopkins kernels (eigenfunctions).

Current printability verification methods tend to simulate the whole mask layout image with the most accurate model using very conservative criteria. This tends to increase the runtime of the printability verification along with the number of false errors.

In current art, printability verification is done with the largest number of Hopkins kernels that are computationally possible. The larger the number of the kernels used, the greater the accuracy of the resulting simulated image. On the other hand with as the number of kernels used increases, the runtime performance for printability verification gets slowed down considerably. The same simulation accuracy is used over the whole layout irrespective of whether there is any error or not. Typically, over the majority of the layout, there are no printability errors. Furthermore, the goal of printability verification is to determine the existence of errors in printability, and identify such errors, rather than accurately determining what the image will look like. However, it is also important that any real printability errors are not missed as a result of less accurate simulations.

In view of the above, there is a need for a fast method of mask printability verification that is efficient in identifying printability errors without missing any such errors.

SUMMARY OF THE INVENTION

Accordingly, it is an object of the present invention to provide a method for efficient computation of printability verification on a lithography layout.

It is another object of the present invention to progressively increase the accuracy of the printability verification simulation.

It is a further object of the present invention to provide a method to quickly prune out regions of the mask layout devoid of any errors.

It is yet another object of the present invention to use higher accuracy on regions of potential errors.

It is a more particular object of the present invention to provide a reasonably accurate solution for printability verification.

It is still another object of the present invention to provide a programmable method to perform printability verification on a mask layout with progressively increased accuracy.

It is still a further object of the present invention to provide an iterative methodology for printability verification wherein the accuracy is progressively increased iteratively.

It is yet another object of the present invention to provide an iterative methodology for printability verification wherein the number of false errors is minimized at the final output results.

These and other objects, aspects, and advantages of the invention are provided by a method of verifying a lithographic mask layout, the method comprising the steps of: providing a catastrophic error metric; providing a plurality of image models, wherein said plurality of image models is ranked according to relative accuracy; simulating an image for said mask layout using at least one of said plurality of image models; identifying a violation of said catastrophic error metric in said simulated image; identifying a portion of said mask layout corresponding to said simulated image that includes said violation; and simulating a next image for said portion of said mask layout using a next of said plurality of image models having greater accuracy than said at least one of said plurality of image models used in the prior step of simulating.

According to another aspect of the invention, the verification is iteratively performed, wherein each portion of the mask layout where a potential catastrophic error is identified is verified using images simulated with a more accurate model, or set of models, until the maximally accurate model simulations are evaluated. If any of the portions of the mask layout previously identified no longer indicate a potential catastrophic error, those portions of the mask layout may be eliminated from further verification iterations and simulations, thus significantly improving turnaround of verification over convention methods.

According to yet another aspect of the invention, the models may include a set of optical models that progressively use a reduced subset of SOCS kernels ranked according to optical influence, wherein more SOCS kernels are introduced to form progressively more accurate optical models.

According to another aspect of the invention, the models may include a set of resist models, that include SOCS terms as in a corresponding intermediate accuracy optical model, and may include image traits of varying influence. Class 2 polynomial resist models may include the SOCS kernel terms, and may include some local image trait terms. Class 1 polynomial resist models include longer range image trait terms. According to a preferred embodiment, class 2 and class 1 models are constructed, and during calibrated, a cross-over verification iteration is determined to provide efficient classification catastrophic errors.

According to another aspect of the invention, catastrophic errors due to an excessive light error, such as a bridging error, a side-lobe printing error or an SRAF printing error, the simulation preferably comprises a bright field simulation. If the violation comprises an insufficient light error, such as a necking error or a line-end shortening overlay error, then the simulation preferably comprises a dark field simulation.

The foregoing and other features and advantages of the invention will be apparent from the following detailed description of the invention.

BRIEF DESCRIPTION OF DRAWINGS

Referring to the exemplary drawings wherein like elements are numbered alike in the several Figures:

FIG. 3D illustrates density kernels.

DETAILED DESCRIPTION

In describing the preferred embodiment of the present invention, reference will be made herein to FIGS. 1-16 in which like numerals refer to like features of the invention. The figures are not necessarily drawn to scale.

Catastrophic Print Errors

Figure 1:
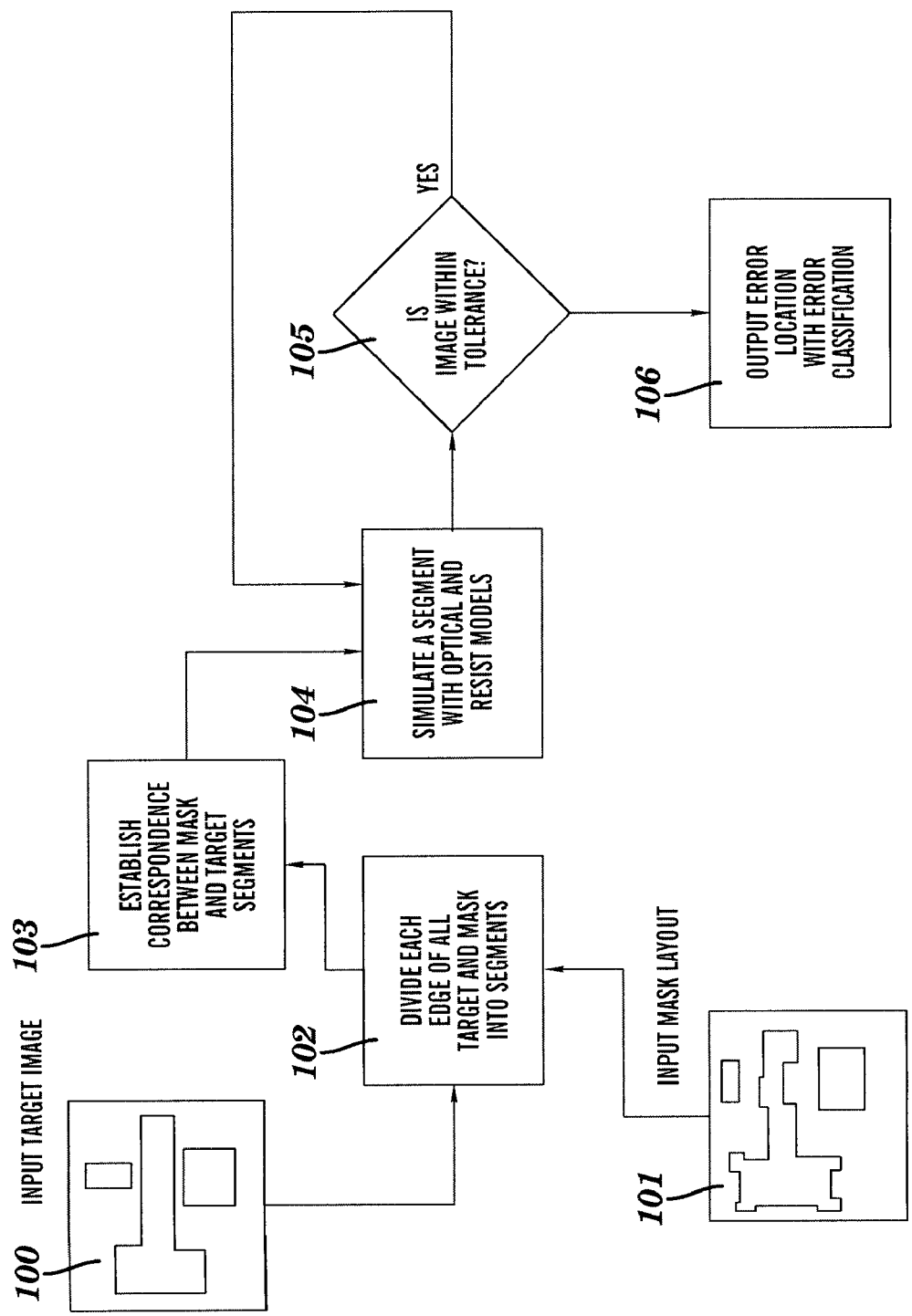
FIG. 1 illustrates a flow chart of a prior method of verifying a mask layout.

A typical printability verification methodology is illustrated in FIG. 1. The input to a conventional printability verification procedure includes one or more input mask layouts 101 typically resulting after application of RET and/or OPC to the initial mask layout. A target wafer image 100 is also provided as an input. In the next step (Block 102) all the target and mask shapes are typically divided into edge segments, and then (Block 103), a correspondence is established between each mask and target shape segments. In the next step (Block 104), the formation of the wafer image segment corresponding to each mask segment is simulated using a calibrated resist and optical model. The simulated wafer segment is then compared against the corresponding target segment (Block 105). If the simulated wafer segment does not match the corresponding target segment, within a predetermined tolerance, it is reported as an error (Block 106).

Figure 1A:
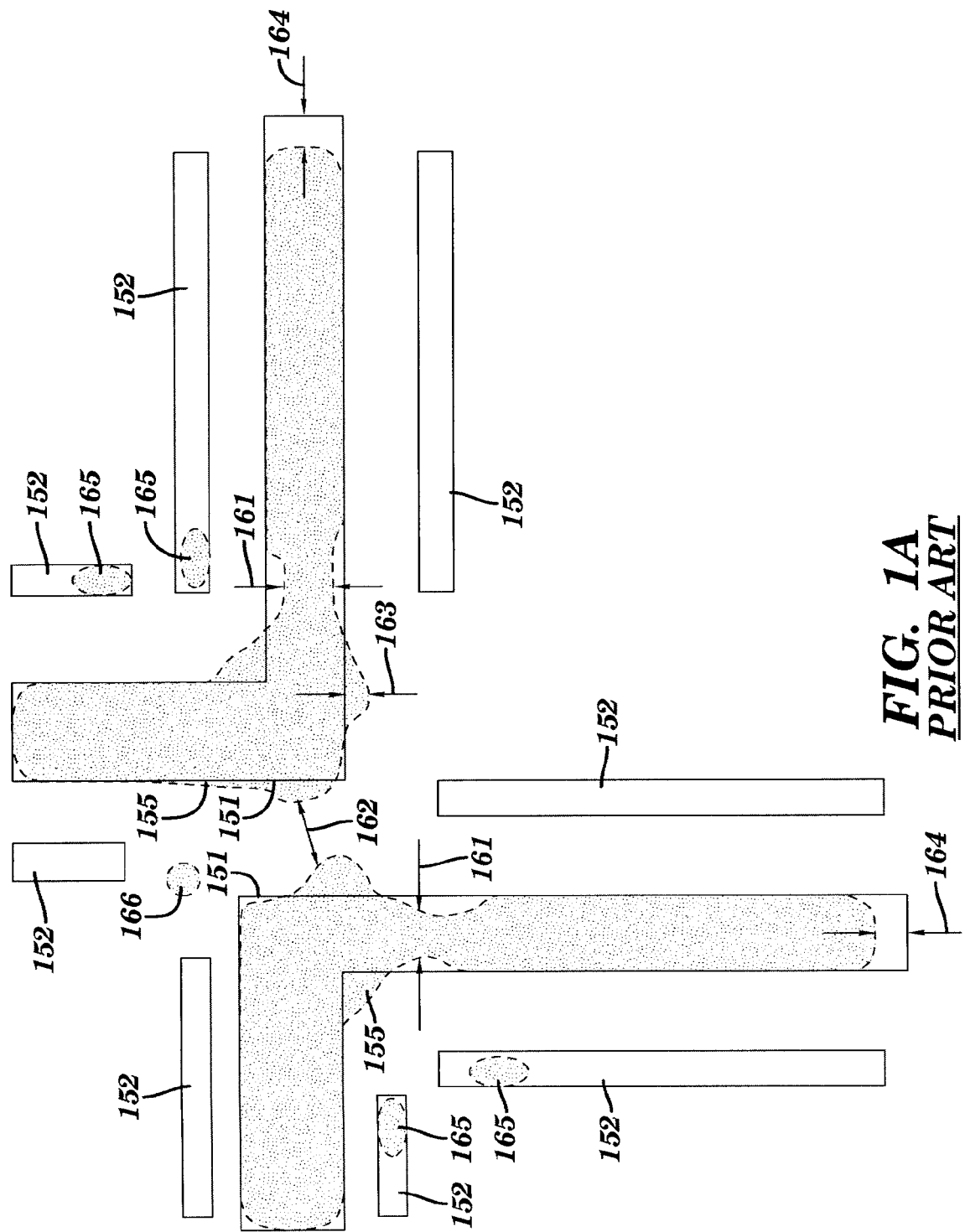
FIG. 1A illustrates some types of errors that may occur in the image of a mask layout.

The proper functioning of a chip requires strong or tight tolerance criteria on the printability of a wafer image. Any deviation from the tolerance of the simulated wafer image from the target image is depicted as an error. FIG. 1A schematically illustrates primary mask layout shapes 151 and sub-resolution assist features (SRAFs) 152 on the mask (which do not print themselves, but assist in the printing of the main mask shapes 151) overlain with resulting simulated printed wafer image shapes 155. Examples of various kinds of errors are illustrated in FIG. 1A:

A "Necking or Pinching Error" 161 occurs where a width of the wafer image is smaller than a pre-determined minimum width value.

A "Bridging Error" 162 occurs where the spacing between two wafer images is smaller than a pre-determined minimum spacing value.

An "Edge Placement Error (EPE)" 163 occurs where the wafer image edge is displaced from the target edge of 151 by a distance larger than a predetermined maximum displacement tolerance value.

A "Line End Shortening Error" 164 occurs where the wafer image edge at a line-end is displaced from the target line-end edge of 151 by a distance larger than a predetermined displacement tolerance value.

An SRAF printing error occurs where a part of the SRAF prints 165, even though SRAFs are not supposed to be printed.

Additional printing errors may occur, for example, due to diffraction effects such as Side-Lobe printing artifacts 166.

The errors listed above can be categorized into two types. The errors in the first category are known as the Catastrophic Errors, because the circuit fails to function at all if any of these errors would occur. The other type of error is known as the Performance Errors. Error of this type does not make the circuit malfunction. But the performance of the circuit in terms of its speed or power consumption may degrade with the increasing number of such errors. Examples of Catastrophic errors are: Necking or Pinching Errors, Bridging Errors, SRAF and Additional Image (such as Side Lobe) printing errors. On the other hand Edge Placement Errors are considered to be examples of Performance Errors. Line End Shortening can be categorized as Catastrophic Errors if they happen to miss any connections with the next layer in the chip due to overlay errors. Catastrophic Errors are presented as in an enumerable manner, wherein the mask layout must correct for all of them before the circuit is manufactured. On the other hand the Performance Errors are considered statistically, wherein a small level of Performance Errors may be tolerated across the layout. It is an objective of the present invention to provide a method for detecting Catastrophic Errors in particular.

It is an objective of the present invention to detect, during the verification of the mask design, Catastrophic Errors that would occur in the printed image which may determine whether a circuit would function. Examples of this type of errors are Pinching Error, Bridging Error, SRAF printing error or Side Lobe Printing error (Refer to FIG. 1A). As discussed below, the occurrences of catastrophic errors can be described as having more or less light than is required for a feature to print to the specifications. While the bridging in case of dark-field mask occurs because there is more light than the resist threshold, the bridging in case of bright field mask happens because there is less light than the resist threshold. Similarly, it can be noted that the while the pinching in case of dark-field mask occurs because there is less light than the resist threshold, the pinching in case of bright field mask happens because there is more light than the resist threshold.

Figure 1B:
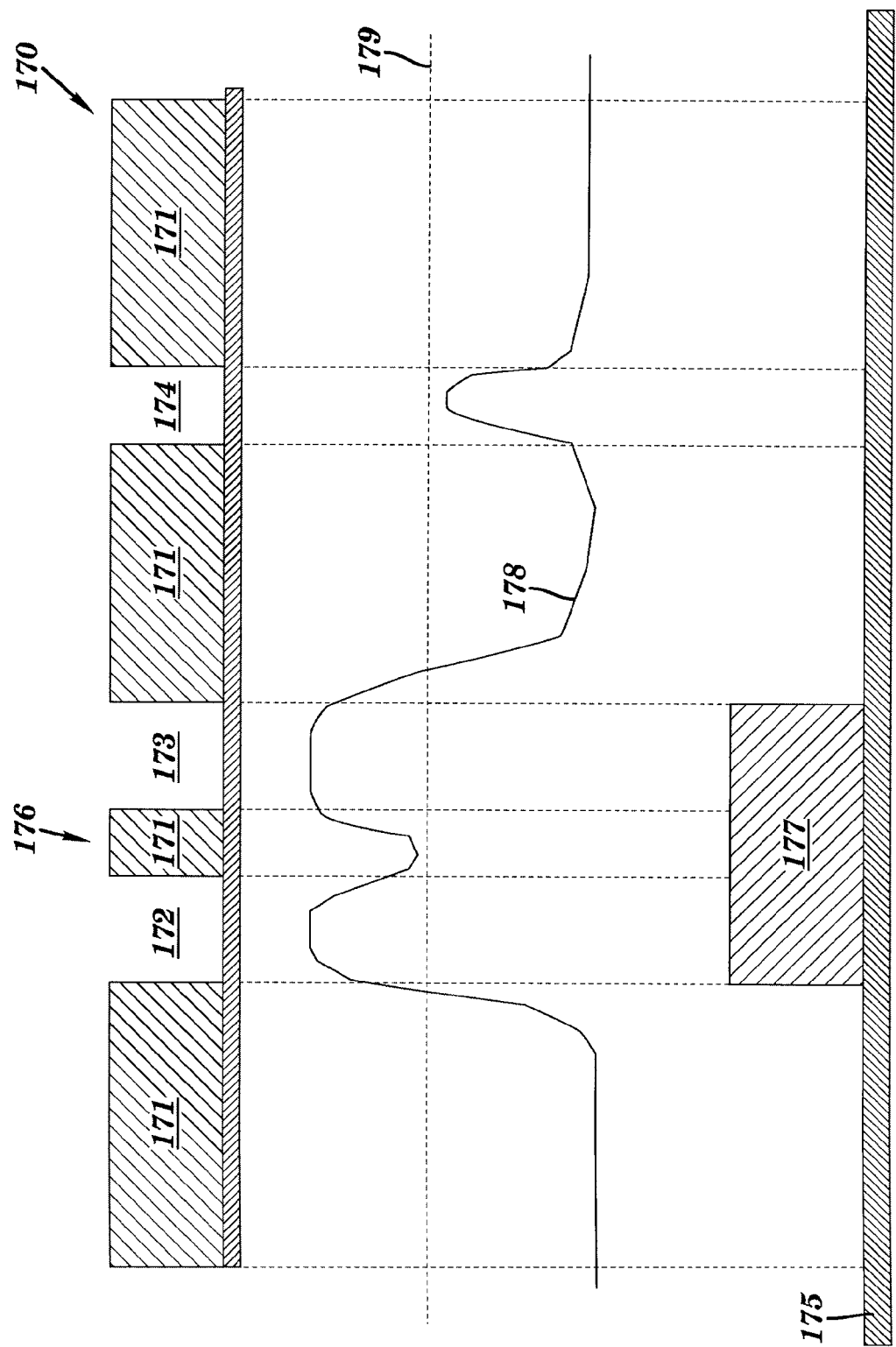
FIG. 1B illustrates a cross-section view of a dark field mask and the corresponding image.

The occurrences of printed errors, whether catastrophic errors or performance errors, can be described as having more or less light than is required for a feature to print to the specifications. This is described with the help of FIG. 1B and FIG. 1C. FIG. 1B, shows a profile of imprinting of a wafer image by lithographic process using a Dark Field Mask. FIG. 1B, shows a profile of imprinting of a wafer image by lithographic process using a Bright Field Mask. The shapes in a dark field mask are created by openings within a dark background. The bright field mask on the other hand has a clear background and shapes are dark regions in that.

FIG. 1B shows part of a dark field lithographic mask 170 in profile. The dark background created by depositing chrome on glass is shown as 171. There are three shapes or openings on the mask, viz., 172, 173 and 174, 176 denotes a narrow space between shapes 172 and 173. Opening 174 denotes a narrow line shape. Also illustrated is the corresponding part of the wafer 175 on which the image is to be transferred. The intensity of light transmitted through the mask 170 on the wafer 175 is shown as the curve 178 in profile. The resist threshold 179 is the light intensity at which the image prints. An image intensity above the resist threshold 179 creates an image in the resist on the wafer 175 whereas an image intensity below the resist threshold 179 does not. The image created on the wafer 175 is shown in profile as the resist shape 177. It can be seen from the corresponding resist image 177 that the narrow space 176 does not exist on the wafer creating a Bridging Error. Similarly, it can be seen from the corresponding wafer image for the narrow line 174 does not exist on the wafer, creating a Pinching Error. Both the Bridging Error and the Pinching Error are Catastrophic errors.

Figure 1C:
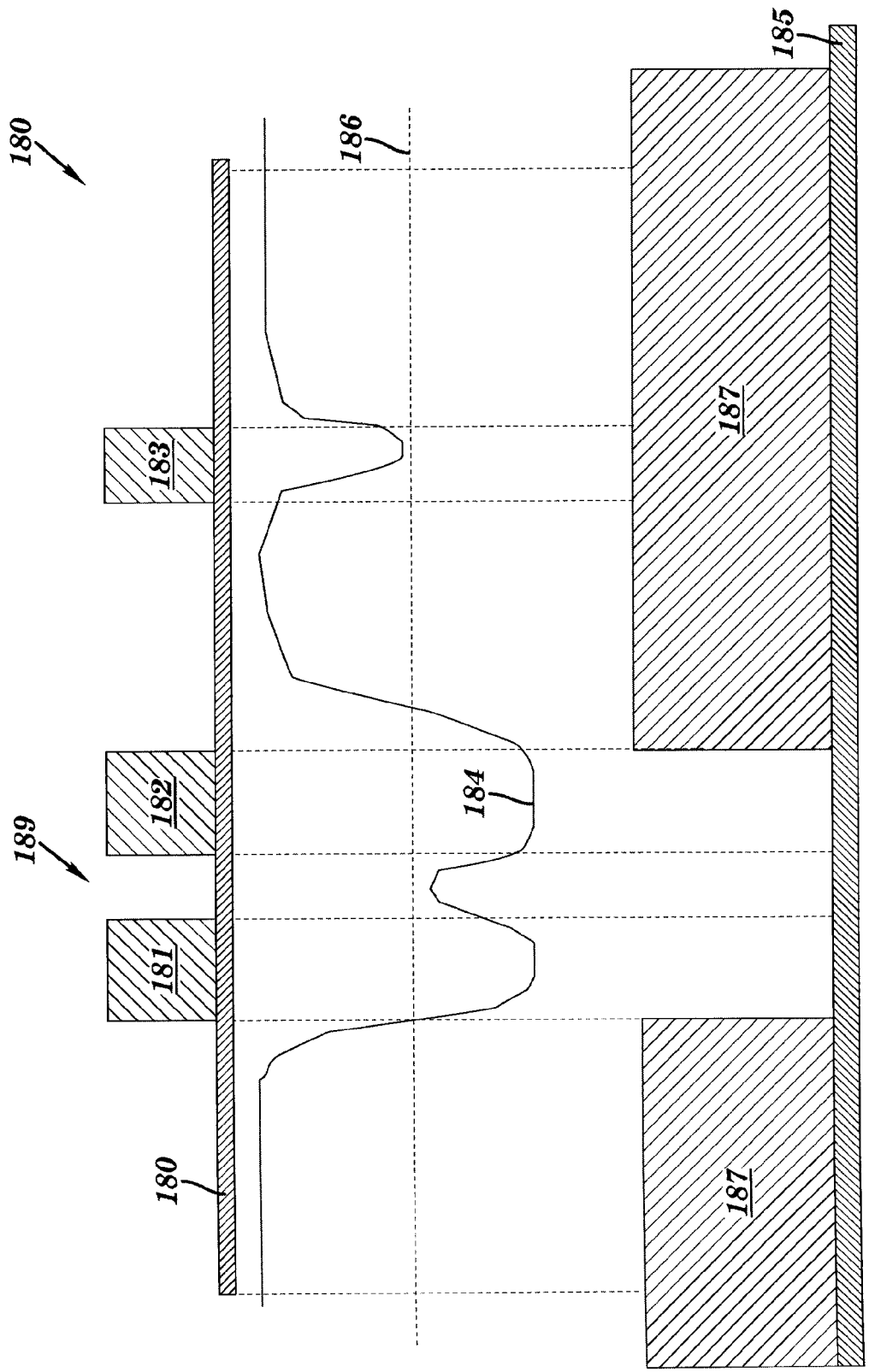
FIG. 1C illustrates a cross-section view of a bright field mask and the corresponding image.

FIG. 1C shows part of a bright field lithographic mask 180 in profile. There are three shapes on the mask, viz., 181, 182 and 183 created by depositing chrome on glass 180 of a clear background. The mask 180 includes a narrow space 189 between shapes 181 and 182, and a narrow line 183. The mask image is to be transferred to a corresponding part of a wafer 185. The intensity of light transmitted through the mask 180 is shown as the curve 184 in profile. Also illustrated is a resist threshold 186 that represents the level of light intensity at which the image prints. An image intensity above the resist threshold 186 creates an image in the resist on the wafer 185 and an image intensity below the resist threshold 186. The image created on the wafer 185 is shown in profile as the resist shape 187. It can be seen from the corresponding wafer image 187 for the narrow space 189 does not exist on the wafer creating a Bridging Error. Similarly, it can be seen from the corresponding wafer image 187 for the narrow line 183 does not exist on the wafer creating a Pinching Error. The Bridging Error and the Pinching Error are Catastrophic errors.

It can be noted that the while the bridging error in case of dark-field mask 170 in FIG. 1B is occurring because there is more light than the resist threshold 179, the bridging error in case of bright field mask 180 in FIG. 1C is happening because there is less light than the resist threshold 186. Similarly, it can be noted that the while the pinching error in case of dark-field mask 170 in FIG. 1B is occurring because there is less light than the resist threshold 179, the pinching in case of bright field mask 180 in FIG. 1C is happening because there is more light than the resist threshold 186.

Figure 3A:
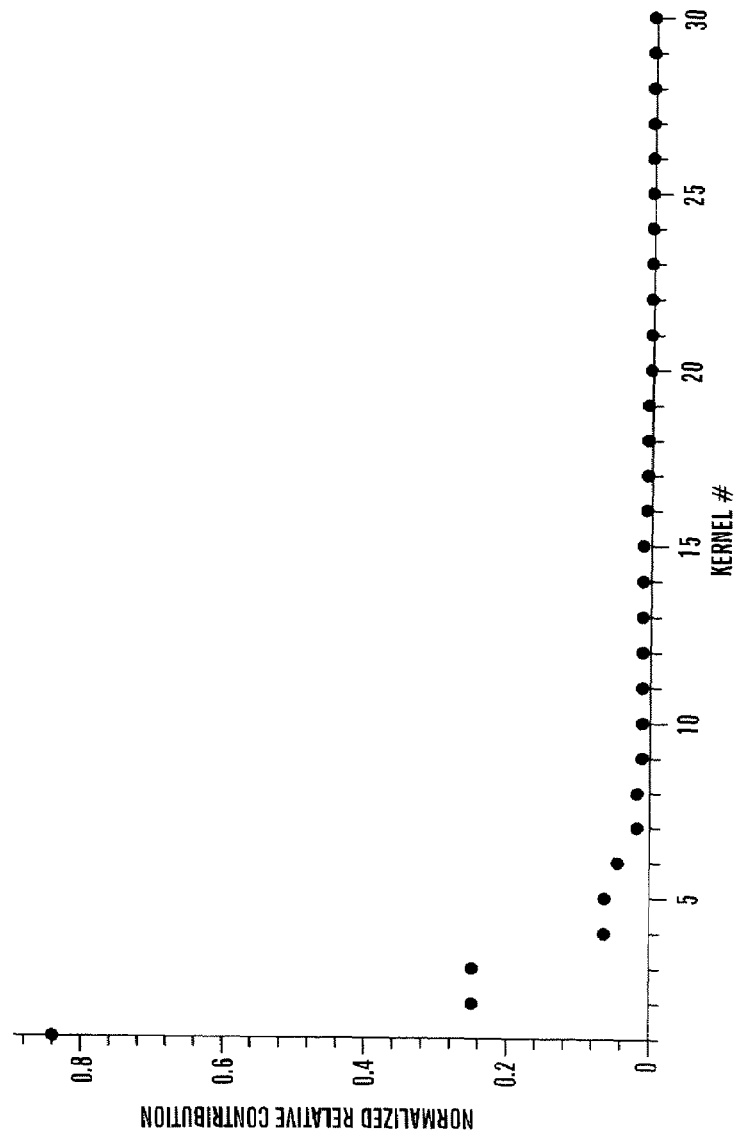
FIG. 3A illustrates a plot showing the relative contribution of SOCS kernels to image intensity.
Figure 3B:
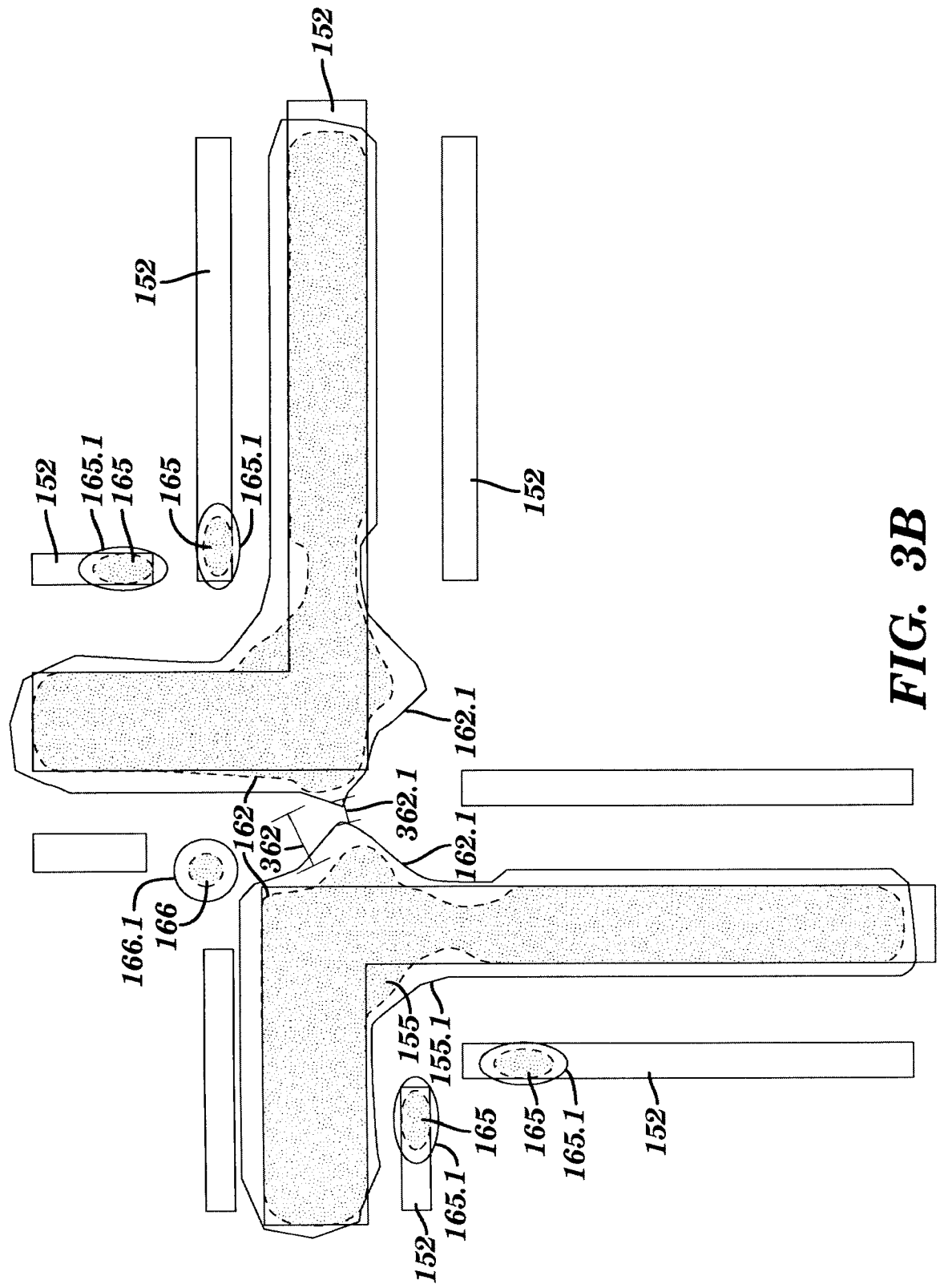
FIG. 3B illustrates a comparison of image contours simulated with models using different numbers of SOCS kernels for a bright field mask.
Figure 3C:
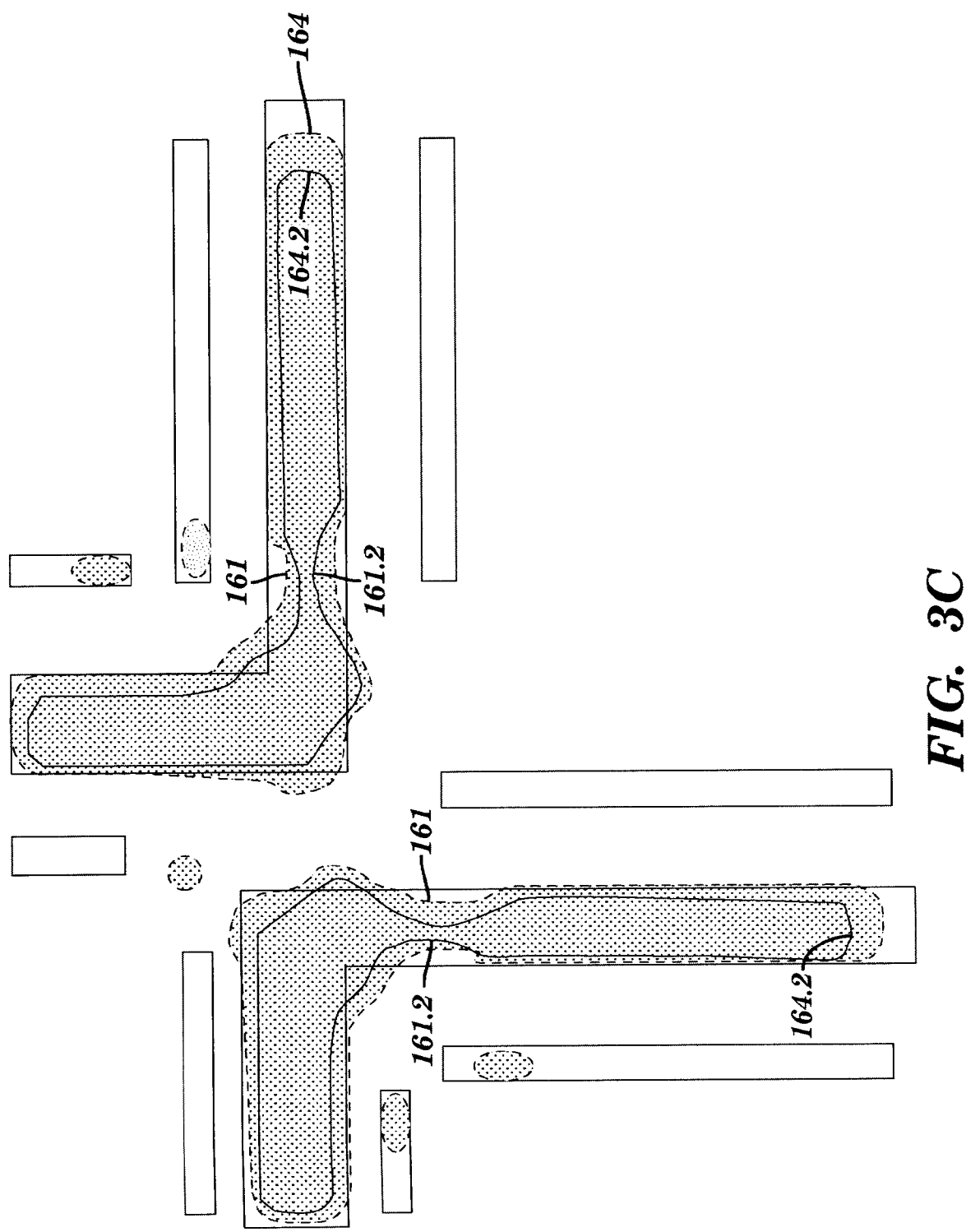
FIG. 3C illustrates a comparison of image contours simulated with models using different numbers of SOCS kernels for a dark field mask.

To aid in the understanding of the present invention, the effect on the simulated image of fewer optical kernels than the maximum is illustrated with the help of FIG. 3B and FIG. 3C.

FIG. 3B illustrates a top down view of a bright field mask, including opaque shapes 152 arranged on a from a bright (e.g. transparent) field 160, corresponding to FIG. 1A, as well as the resulting simulated image contours superimposed on the corresponding imaged mask shapes 152. The image contours 155.1, 162.1, 165.1, 166.1 computed using fewer kernels than the maximum enclose the image contours 155, 162, 165, 166 computed with the maximum number of kernels. This is because the simulation using fewer kernels tends to put more light everywhere than when more kernels are included. Therefore, computation using fewer kernels gives a more conservative estimate of errors involving excessive light, such as bridging errors, side-lobe printing and SRAF printing. Errors are identified when the simulated contours violate a predetermined catastrophic error metric. For example, if the space 362.1 between two contours 162.1 computed with fewer kernels than the maximum number of kernels is smaller than a predetermined minimum space threshold, that indicates that there may be a bridging error, and thus the region of the mask around space 362.1 would require further examination with a more accurate verification model. For example, the space 362 between more accurate contours 162 computed with the maximum number of kernels, although larger than the space 362.1 between the less accurate contours 162.1 may still be larger than the minimum threshold, and the region at space 362 would be flagged as a bridging error. However, if the space 362.1 between the two less accurate contours 162.1 is larger than the minimum space threshold, then space 362.1 may be eliminated as a potential bridging error and need not be further examine with a more accurate verification model. Similarly, contour 165.1 provides a conservative indication of a possible SRAF printing error corresponding to SRAF shapes 152 where the contour of 165.1 computed with a fewer number of kernels encloses that of contour 165 computed with the maximum number of kernels. Likewise, contour 166.1 provides a conservative indication of a possible a side-lobe printing error corresponding to contour 166 where the contour of 166.1 computed with fewer kernels encloses that of contour 166 computed with the maximum number of kernels. Thus, in accordance with the present invention, errors related to excessive light are preferably detected by simulating mask images for a bright field mask.

By contrast, errors related to insufficient light are preferably detected, in accordance with the invention, by reverse toning the bright field mask and simulating the mask images for the corresponding dark field mask. FIG. 3C illustrates a top down view of a dark field mask including shapes clear 252 (corresponding to opaque shapes 152 of the bright field mask of FIG. 3B), arranged on a dark field 171, corresponding to FIG. 1A, with superimposed simulated contours of the shapes 252. The contours 161.2, 164.2 computed using fewer kernels than the maximum are enclosed by the image contours 161, 164 computed with the maximum number of kernels. This is because in case of the dark-field mask the simulation using fewer kernels tends to put less light every where than with all the kernels. Thus, as the number of kernels used in the model are increased to improve simulation accuracy, the contours of the imaged features in the dark field mask will expand. Therefore, computation using fewer kernels gives a more conservative estimate of catastrophic errors involving insufficient light, such as necking errors, line-end shortening, etc. For example, contours 161.2 computed with fewer kernels than the maximum number of kernels used to compute contour 161 have a width 365 that is smaller than a predetermined minimum width, which conservatively indicates a possible a necking error. Further evaluation of the region width 366 based on contour 161 using the maximum number of kernels may used to confirm whether the width 366 is less than the minimum width. On the other had, if the width 365 based on less accurate contour 161.2 is larger than the minimum width, this region may be eliminated as a necking or pinching error and may pass the verification testing without further examination. For another example, by the location of contours 164.2 computed with fewer kernels than the maximum, a possible line-end shortening error may be conservatively identified, which would be a catastrophic error in the presence of a catastrophic overlay error. On the other hand, such an error may be eliminated from further consideration if the location of the less accurate contour 164.2 meets specifications relative to the desired line-end. If a potential line-end shortening error is identified, then further examination of the location of contour 164 using the maximum number of kernels may then be used to confirm whether the line-end shortening error exists, since the line-end shortening of contour 164 will be reduced in a more accurate dark-field model.

Therefore, mask verification in accordance with the present invention is preferably performed using bright field mask simulation to identify regions of possible catastrophic errors associated with excessive light, such as, but not limited to, bridging, side lobe or SRAF printing types of errors. Preferably, catastrophic errors associated with insufficient light may be similarly detected, in accordance with the invention, by first reverse-toning the mask and simulating the corresponding dark field images.

II. Inventive Iterative Verification Methodology

The current embodiment is described with reference to FIGS. 3 and 3A. Once a model is created using the process described as in FIG. 3, one can easily plot the relative contributions of the kernels as illustrated in FIG. 3A. The process parameters for this model are shown on the Figure. As can be seen in this figure the relative contribution for Kernel 1 is very significant. Next the difference in contribution comes after Kernel 2 and 3. The next difference is at Kernel 6. Beyond Kernel 6, the relative contributions of individual optical kernels are very small. Using the above logic the methodology described in FIG. 4, divide the kernels in subsets such as Kernel 1, Kernels 1-3, Kernels 1-6; and finally all the kernels. It can be easily surmised that any one ordinarily skilled in the art may be able to use the procedure above break the kernels in any other subsets in the order of their diminishing significance and obtain similar results.

Construction of Models for Verification

Figure 2:
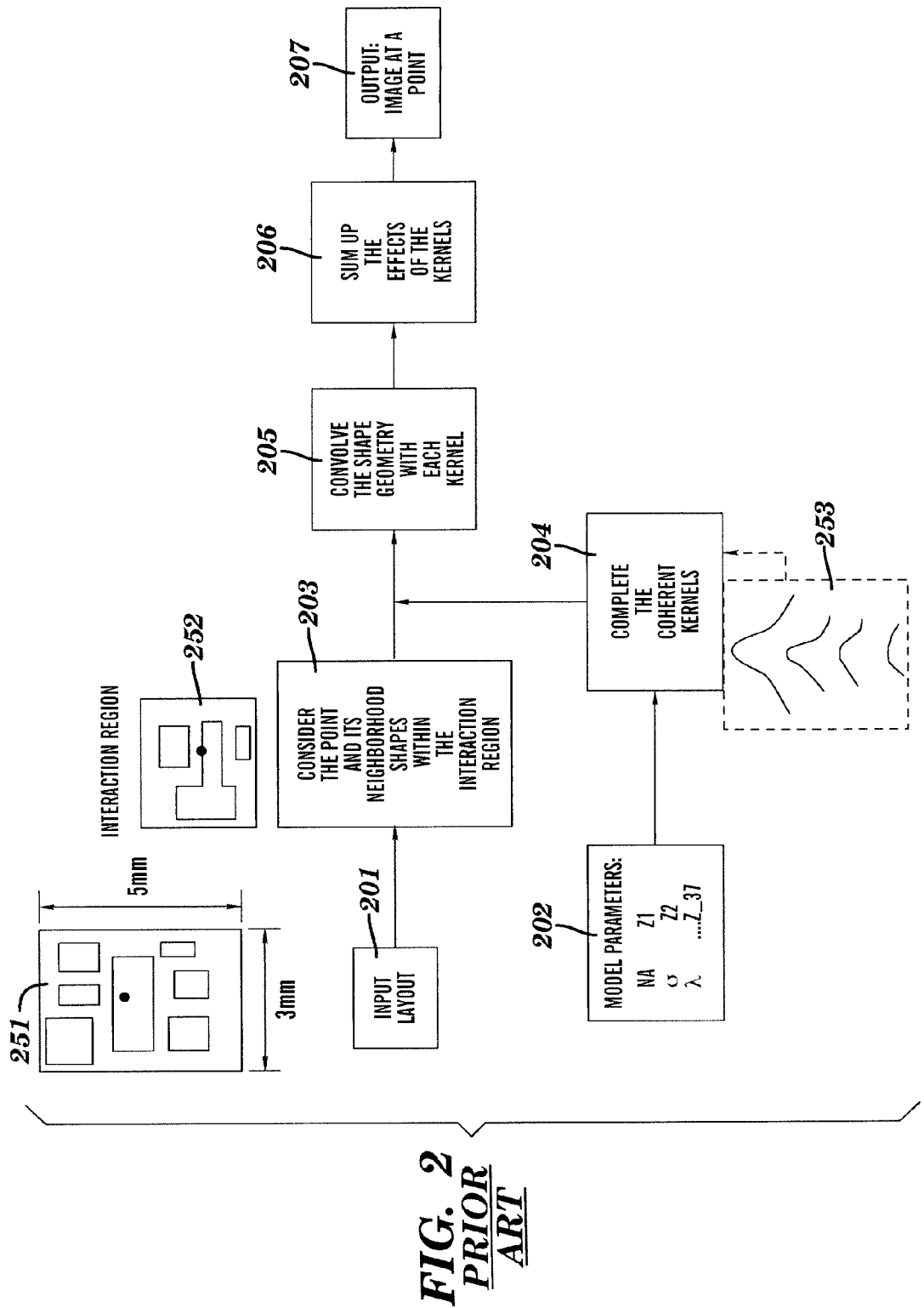
FIG. 2 illustrates a flow chart of modeling an optical image.

A majority of the computation time involved in the printability verification process results from simulating the image using the optical model. Referring to FIG. 2, there is described a typical methodology for simulating the image intensity at a given point due to optical effects. The input to the simulation methodology includes a mask layout 201 and a selected simulation point 251, and a set of process parameters 202 including the light wavelength $\lambda$, one or more source parameters, such as $\sigma_1$ and $\sigma_2$, the numerical aperture NA and Zernike parameters Z1, Z2, . . . , Zn, defining the lens aberrations. In the next Block 203, an optical interaction region 252 around the simulation point 251 is considered, as are all the mask shapes or portions thereof within the interaction region 252. The interaction region 252 is typically a square box having dimensions of a few microns that encloses all shapes that will have a significant optical influence on the image intensity at the simulation point 251. The size of the interaction region 252 is determined by the tradeoff between computational-speed versus desired accuracy. In Block 204, the SOCS (Sum of Coherent Systems) kernels 253 are computed for use in approximating the image based on the Hopkins model, which description is given hereinafter. In Block 205, the shapes within the interaction region 252 (as determined in Block 203) are convolved with the kernels 253 obtained in step 204. The resulting convolutions of the kernels 253 with the shapes in the interaction region 252 are summed (Block 206) and used to approximate the particular image intensity value at the simulation point 251 (Block 207).

Optical models used in printability verification are typically the same optical models that may be used in model-based optical proximity correction (MBOPC). These approaches are in one form or another, related to the Sum of Coherent Source (SOCS) method, which is an algorithm for efficient calculation of the bilinear transform.

Sum of Coherent Systems (SOCS) Optical Model

Conventional image simulation is typically done using the Hopkins integral for scalar partial coherent image formation, where the expression for the aerial image intensity $I_0$ is given by, $$I_0(\vec{r}) = \iiint d\vec{r}\,' d\vec{r}\,'' h(\vec{r} - \vec{r}\,') h^*(\vec{r} - \vec{r}\,'') j(\vec{r}\,' - \vec{r}\,'') m(\vec{r}\,') m^*(\vec{r}\,''),  \quad \text{Equation 1}$$

where, h is the lens impulse response function (also known as the point spread function or PSF);

j is the coherence;

m is the mask transmission function;

* indicates the complex conjugate; and $\vec{r}$ is the position of the image.

The integration is typically performed over the mask. The expression:

$$h(\vec{r}-\vec{r}\,')h^*(\vec{r}-\vec{r}\,')j(\vec{r}-\vec{r}\,'') \qquad \text{Equation 2}$$

is known as the Hopkins kernel, which is a fixed two-dimensional (2D) function for a given system.

This 4-dimensional (4D) Hopkins integral (Equation 1) may be approximated as an incoherent sum of 2-dimensional (2D) coherent image integrals. This method of computing the Hopkins integral is known as the sum of coherent systems (SOCS) procedure. In the SOCS procedure, an optimal n-term approximation to the partially coherent Hopkins integral is:

$$I_0(\vec{r}) \cong \sum_{k=1}^{n} \lambda_k |(m \otimes \phi_k)(\vec{r})|^2 = \sum_{k=1}^{n} Q_k(\vec{r}) \qquad \text{Equation 3}$$

where $Q_k(\vec{r})=|(m \otimes \kappa_k)(\vec{r})|^2$, $\otimes$ represents the two-dimensional (2D) convolution operation, and $\kappa_k=\phi_k(\vec{r})\sqrt{\lambda_k}$ is the Hopkins kernel, where $\lambda_k$, $\phi_k(\vec{r})$ represent the $k^{th}$ eigenvalue and eigenfunction, respectively, of the Hopkins kernel, derived from the Mercer expansion of:

$$h(\vec{r}\,')h^*(\vec{r}\,'')j(\vec{r}\,'-\vec{r}\,'') = \sum_{k=1}^{\infty} \lambda_k \phi_k(\vec{r}\,')\phi_k(\vec{r}\,''), \qquad \text{Equation 4}$$

which suggests that a partially coherent imaging problem can be optimally approximated by a finite sum of coherent images obtained, for example, by linear convolution. Typically, the source and the mask polygons are decomposed (e.g. into grids or sectors), and each field image is computed as an incoherent sum of coherent sub-images (also referred to as component-images, or pre-images). The total intensity at an image point r in question is then the sum over all component images. In the SOCS approximation, the number of coherent sub-images that must be calculated is minimized, for example, by diagonalizing the image matrix to achieve an acceptable approximate matrix of minimal rank by eigenvalue decomposition. For example, even a large-fill source can be adequately approximated when the number of 2D convolutions n is about 10. Asymmetrical artifacts may occur that are related to multiplicity of eigenvalues, but such asymmetry effects are typically too small to cause catastrophic errors, can be ignored for the purposes of the present invention.

Thus, the image intensity at a point is typically simulated as a summation of coherent sub-images, wherein each sub-image is typically formed by convolutions of a sufficient number of ranked eigenvalues of the image matrix. The accuracy of the above approximation depends on the number of terms in the summation. If the number of terms is infinite, it tends to become close to the actual integration. However, in the current art, considering more than about 16 kernels becomes prohibitively expensive computationally. However, for most practical purposes usage of more than the 10 largest eigenvalues in a MBOPC application are rare. On the other hand the contributions of the kernels become increasingly small beyond the 16 largest eigenvalues of the image matrix. This is illustrated in FIG. 3A.

The relative contribution of SOCS kernels is illustrated in FIG. 3A, where the normalized relative contribution to the image intensity is plotted as a function of ranked kernels in an optical model based on the Hopkins SOCS approximation. The process parameters listed in FIG. 3 are for illustration purposes only, and are not limiting. As can be seen in FIG. 3A, the relative contribution of kernels decreases rapidly as a function of ranked kernel, and beyond Kernel 6, the relative contributions of individual optical kernels are very small.

Threshold Models

Verification of printability also involves modeling non-optical lithographic process effects other than effects from the optical system, such as the response of the resist to the optical image intensity. Constant Threshold Resist (CTR) models assume that there is a fixed intensity level, i.e. the constant threshold, at which the resist will interact with the light and form a printed image (i.e. develops). However, the resist may respond in a non-linear fashion to the intensity, influenced by such factors as slope, curvature, and the maximum and minimum intensity in the region around a point of interest, which in turn may be influenced by factors such as the spacing and size of features in the patterns to be printed. To predict an effective response of the resist to the intensity simulated by the optical model, variable threshold models are preferably used. Such variable threshold models are constructed to predict the effective intensity thresholds at which the image will print in response to the radiation transmitted by the optical system through a mask as a function of various image traits. The variable threshold models, expressed as functions of traits of the optical image, are calibrated based on empirical data using test patterns that are representative of the circuit patterns. The intersection of the modeled variable threshold with the simulated image intensity provides contour locations that predict the shapes that will be printed on the wafer. Equivalently, the models may be used to predict the offset of the contours relative to target shapes desired to be printed on the wafer.

The variable threshold values are typically computed at an image point using a threshold process model that is a function of terms that are derived from various traits of the simulated optical image, such as Imax, Imin, slope and curvature, typically computed at a fixed vertical position, or computed as an average over a fixed band of vertical positions. Each image trait varies as a function of horizontal position (x,y) and intensity. A threshold process model is typically written in the form of a sum of terms, such as a polynomial. The optical image intensities from which the image traits are derived are computed with the full set of SOCS kernels. Such a threshold process model is hereinafter referred to as the "standard process model". The coefficients of the standard process model are determined by fitting the standard process model to empirically measured data.

In accordance with the present invention, a maximally accurate variable threshold process model is first constructed that is at least as accurate as the standard model. The maximally accurate model may comprise all the terms of the standard process model as well as additional terms formed from the SOCS model.

Secondly, according to the invention, one or more additional sets of intermediate models are constructed so that each set of intermediate models progressively includes an increasing number of terms and factors that contribute to the construction of the maximally accurate model. The intermediate models are constructed to progressively include additional contributions from the maximally accurate model, as discussed further below. The intermediate models so constructed, in accordance with the invention, converge to the maximally accurate model as the contributions to the intermediate model progressively increase to match the contributions of terms and factors used in the maximally accurate model. The sets of intermediate models having fewer contributions than the maximally accurate model will be correspondingly relatively faster to compute.

The maximally accurate model is constructed as a function, such as a polynomial, having a series of substantially monotonically decreasing contributions to the image at a given evaluation point. The number of terms to be used in the maximally accurate model should be sufficient to simulate non-linear behavior of the lithographic process, but need not be more than necessary to provide a smooth fit to the data. For example, one criterion that may be used is that the number of empirical data points should exceed the number of terms by at least a factor of ten. The coefficients of the terms in the maximally accurate model are determined by fitting the predicted model intensity threshold values to intensity threshold values based on empirically measured data, such as SEM measurements of line widths obtained from test patterns printed using the nominal process conditions. The fitted maximally accurate process model may then be used in combination with the optical model to simulate the behavior of the image transfer that includes other non-optical process effects.

Note that the present invention is not limited to separately constructing and calibrating the models, but construction of models may be performed simultaneously with or included as part of the calibration of the models. For example, according to one embodiment of the invention, the polynomials may be constructed by choosing the most strongly predictive combinations of traits, for example, by performing forward stepwise regression, discussed further below in the section on calibration.

The terms of the standard process model typically include terms derived from certain traits of the simulated optical image, such as slope, curvature, Imax, and Imin. Imax and Imin are the maximum and minimum intensity values within a distance around the point of interest on a feature edge. For example, Imax typically varies in the range between about 0.2 to 0.3 and Imin typically varies between 0 and about 0.15. The slope of intensity at the point of interest is first derivative of the intensity with respect to distance along a perpendicular to the feature edge being imaged. The curvature is the second derivative of the intensity with respect to distance along a line parallel to the feature edge at the point of interest.

Standard models also typically include between n=5 to 10 density kernel terms, Dn. Referring to FIG. 3D, the density kernel Dn is calculated as the fraction of a particular annular zone centered on a point 110 on the edge of a feature 120 which, in this example, is defined as a contour at a reference print threshold. A region of optical influence (ROI) 130 around the point of interest 110 is subdivided into annular zones, typically having equi-stepped radii, and are numbered sequentially, from the innermost disk, D1, to the outermost ring (e.g. D7 in this example). In some cases only a compact inner set of annuli is used, extending from D1 through a final ring having a smaller outer radius than the ROI. The value of the density kernel at a particular edge location, such as 110, is computed by computing the area of the image portion that lies within the threshold contour. For example, the ratio of the thresholded area 100 to the entire area of the annulus D4 is the value of the D4 density kernel term. In the case of an annulus D6 that intersects thresholded features 150 and 120, having thresholded areas 141 and 142, respectively, the value of the D6 density kernel is the ratio of the sum of areas 141 and 142 divided by the total area of the annulus D6.

In accordance with the present invention, the maximally accurate model also includes terms formed from cross-products of the image traits with terms for the SOCS contributions made by successive kernels, e.g. to the intensity at the center or reference edge of the feature to be printed. (The process model function, e.g. polynomial, would typically include the image trait terms and SOCS terms individually as well.) If the polynomial used in the maximally accurate model contains the same terms as current, standard OPC resist models, then the maximally accurate model will be at least as accurate as the standard resist model in its final predictions (i.e. in its last-stage predictions after all SOCS kernels have been calculated). This guarantee of accuracy at least as good as the standard resist model comes at the price of requiring that the intensity be calculated at many points along a cutline through the feature fragment in question, since standard traits like Imax and Imin are found from such an extended cutline calculation. This is also required in the standard resist model. However, in most cases, the maximally accurate model according to the present invention has the advantage of using fewer kernels than in the standard resist model. Note that the polynomials used in the approximation to the resist model, in accordance with the present invention, will also have new terms involving the SOCS kernel values, and that even the standard terms (Imax, Imin, etc.) will have different numerical values when they are calculated using image intensities simulated with a smaller number of SOCS kernels.

In accordance with the invention, the intermediate process models are also constructed in a similar manner, except that a fewer number of successive image trait terms and SOCS terms are included. The coefficients of these intermediate process models are then determined by fitting the simulated contour values from the intermediate models to threshold values that are predicted by the maximally accurate process model.

If the polynomial model is used, during early iterations it would be advantageous to use polynomials whose annular pattern density traits (the so-called D kernels) were limited to those of short radii relative to the point where the intensity is being calculated. For example, terms involving D4, D5, and D6 in the above example might be omitted (with D1, D2, and D3 being included), but all such kernels (if used in the standard resist model) would be included in polynomials for late SOCS iterations. (Typically there might be of order 10 SOCS iterations, i.e. 10 kernels of the SOCS expansion.) Kernels that cover "rings" at larger distances take longer to calculate, yet often have less influence on the outcome at the central point. Only in the final iterations, when only a few hard-to-assess points remain to be evaluated, would it be necessary to bring in kernels that cover the weak influence of distant points.

An example of an intermediate polynomial function that could be used to construct a process model in accordance with the invention is provided below. In this example, the model is constructed using standard modeling traits, such as density kernels, slope, curvature, Imax, and Imin, together with SOCS kernel values, and to include a constant term, linear terms, quadratic terms, and a few key interaction (i.e. product) terms. For example, using six density kernels, the polynomial used to construct an intermediate process model of the variable intensity threshold $I_T(4)[x, y, I]$ after 4 SOCS kernels have been calculated might be:

$$I_T(4)=c0+c1*\text{slope}+c2*I\text{max}+c3*I\text{min}+c4*\text{curvature}+$$
$$c5*D1+c6*D2+c7*D3+c8*D4+c9*D5+c10*D6+$$
$$c11*\text{slope}^2+c12*I\text{max}^2+c13*I\text{min}^2+$$
$$c14*\text{curvature}^2+c15*D1^2+c16*D2^2+c17*D3^2+$$
$$c18*D4^2+c19*D5^2+c20*D6^2+c21*\text{slope}*I\text{max}+$$
$$c22*\text{slope}*I\text{min}+c23*I\text{max}*I\text{min}+c24*Q_1+$$
$$c25*Q_1^2+c26*Q_1*\text{slope}+c27*Q_1*I\text{max}+$$
$$c28*Q_1*I\text{min}+c29*Q_2+c30*Q_2^2+c31*Q_2*\text{slope}+$$
$$c32*Q_2*I\text{max}+c33*Q_2*I\text{min}+c34*Q_3+c35*Q_3^2+$$
$$c36*Q_3*\text{slope}+c37*Q_3*I\text{max}+c38*Q_3*I\text{min}+$$
$$c39*Q_1*Q_2+c40*Q_1*Q_3+c41*Q_2*Q_3$$

The term c0 is typically determined during calibration to be the intensity value that most accurately predicts the printed edge position when applied to all critical images, and is equivalent to the optimum constant threshold used in a CTR model. Note that the calibration data is formed using a nominal lithographic process, in which a reference dose is typically selected so that the minimum space and lines will print at the desired size, as determined experimentally. The inverse of the reference dose is sometimes referred to as the reference threshold. All of these quantities in the inventive variable threshold resist models have the same meaning as in today's standard variable threshold resist models, except for terms of the form "$Q_k$", where $Q_k(\vec{r})=|(m(\vec{x})\kappa_k)(\vec{r})|^2$, and $\kappa_k=\phi_k(\vec{r})\sqrt{\lambda_k}$ is the Hopkins kernel (see Equations 3 and 4 above), which each represent the value of the kth SOCS kernels at the reference position, which is the point at which the reference threshold intersects the image. The reference threshold, as is known in the art, is a constant intensity value that is initially selected as a reference value during calibration of variable threshold models, to anchor the model to an absolute value based on a subset of the empirical data. The reference threshold may be, but is not required to be, close to the optimum constant threshold used in a CTR model. The reference threshold may be typically the level of light energy or dose relative to that transmitted through a completely clear mask. Note that terms involving $Q_4$ have not been included in the polynomial, even though this term is known after the 4th SOCS iteration. The reason is that by construction the sum of the first 4 kernels must equal the fixed reference threshold (in the 4th SOCS iteration), so they are not linearly independent, and no extra predictive power is obtained by including all four.

Optionally, more than one set of polynomials may be constructed to be used different iterative stages of the verification procedure.

According to a preferred embodiment of the present invention, two or more different sets of polynomials are constructed for each increment or iteration of the verification methodology. For example, a first set of polynomials (referred to hereinafter as "class 1" polynomials) would be constructed to accurately predict the edge position (or alternatively, a feature dimension, which is typically determined as the difference between the positions of two printed edges) found by the maximally accurate model using the full set of SOCS kernels. A second set of polynomials (referred to hereinafter as "class 2" polynomials) would be constructed to represent substantially more local conditions, for speed of evaluation. The locality of image traits varies according to a range of influence on the reference position. For example, image intensity, image slope, and image curvature typically reflect conditions in a range less than about 30 nm of the reference position. Imin and Imax typically have influence in a range from about 50 nm to 200 nm. Density kernels may have influence in the range of about 50 nm to about 200 nm for post exposure bake (PEB) and mask effects. Longer range density kernels may have influence from about 200 nm to about 1 micron, or greater. Class 2 polynomials may be constructed by using only the SOCS kernel values, or may include a minimal number of image trait variables, such as slope and $Q_k$ terms. SOCS kernel values may be obtained at the target position for the feature edge. Alternatively, the class 2 polynomial models may be constructed using the SOCS kernel values obtained at the reference position, which is the position where the currently calculated image intersects the reference threshold, and the class 2 polynomial models may be calibrated to predict the offset between the target position or the reference position and the position of the contour that the standard resist model predicts.

Class 1 polynomials are constructed to include additional image trait variables in addition to slope and $Q_k$, such as curvature, Imin, Imax and the density kernels Dn. For a given number of terms and number of SOCS kernels used in the intensity calculations, class 1 polynomials will almost always be more accurate than a class 2 polynomial. Typically about 16 points must be calculated along a cutline in order to determine Imin and Imax (by interpolation), whereas only 2 or 3 points are needed to find the reference position, and no points along the image profile need be calculated if the terms of the class 2 polynomials are evaluated at the target position. Since the reference threshold is typically chosen close to the value of the CTR optimum threshold in a CTR resist model (CTR) the reference position of an edge corresponding to the reference threshold will be close to the printed edge position, and therefore fairly close to the feature edge position, in the typical case where OPC is reasonably accurate. Class 2 polynomials would also be constructed without using density kernels. Thus, the evaluation of class 2 polynomials would therefore be several times faster than those of class 1 polynomials. In accordance with the invention, the faster (but less accurate) models, e.g. class 2 polynomials, are used in the early printability verification iterations, but at a crossover iteration, more accurate polynomials, e.g. class 1 polynomials, are used. During the calibration of the class 1 and class 2 polynomials (discussed further below), the tradeoff between speed and accuracy may be evaluated to select an iteration count at which the crossover should occur. If the class 2 polynomial for a particular SOCS count succeeds in eliminating at least 1/10th as many points from further consideration as does the class 1 polynomial for the same SOCS iteration, it would typically be more efficient to use the class 2 polynomial.

An example of an intermediate class 2 polynomial model for the variable intensity threshold $I_T(4)$ using four SOCS terms is:

$$I_T(4)=c0+c1*\text{slope}+c2*Q_1+c3*Q_1^2+c4*Q_1*\text{slope}+$$
$$c5*Q_2+c6*Q_2^2+c7*Q_2*\text{slope}+c8*Q_3+c9*Q_3^2+$$
$$c10*Q_3*\text{slope}+c11*Q_1*Q_2+c12*Q_1*Q_3+$$
$$c13*Q_2*Q_3$$

The intermediate models (e.g. class 1 and class 2 polynomials) are constructed to substantially predict the outcome of the maximally accurate model. The models may be expressed either as bias models, in which the output is the predicted offset in printed edge position, or threshold models, in which the output is a shift in the printing threshold, as known in the art. In a preferred embodiment, class 1 models are expressed as threshold models, and class 2 models are expressed as bias models. Successive class 1 polynomials will provide successive results that approach the value predicted by the maximally accurate model, since the class 1 polynomials are constructed using image trait variables similar to those used in the standard model. Successive class 2 polynomials predictions generally will not converge to the value predicted by the standard model since they use fewer of the image trait variables and cannot make use of the same information. Therefore, at some point near (usually very near) the final verification iteration, at a cross-over iteration count, the predictions from the less accurate (but faster to compute) intermediate models (e.g. class 2 polynomials) will not be able to be used to conclusively flag even e.g. 1/10th as many of the remaining features for success or failure as would the more accurate intermediate models, e.g. class 1 polynomials. For all later iterations past the cross-over iteration, the method in accordance with the invention would then switch to using more accurate intermediate models, e.g. class 1 polynomials.

In accordance with the preferred embodiment of the invention, during the initial iterations of the inventive printability verification procedure to identify catastrophic errors, class 2 polynomials will be used to simulate or predict the printed image, and after a predetermined iteration count (a cross-over iteration), class 1 polynomials will be used. The predetermined cross-over iteration count may be determined during the calibration phase, by determining for the sample patterns the iteration count at which it becomes more efficient to use class 1 polynomials instead of class 2 polynomials.

The use of more than one class of successive polynomials has the advantage of maintaining convergence of the successive intermediate models to an outcome that is at a minimum, equally as good as the standard process model, and may be superior and more accurate than the standard process model, while also eliminating the need for calculating points along a cutline in most cases.

C. Calibration of the Models

Calibration of the maximally accurate model, which involves determining the coefficients of the image trait and SOCS contribution terms, is performed by fitting the maximally accurate threshold model to empirically measured data, such as SEM measurements of line widths obtained from the printed test patterns.

In accordance with the invention, calibration of the intermediate models are performed by fitting each successive model, using successively more contributing terms, to the values predicted by the maximally accurate model. The calibration phase may be used to tune the verification strategy to provide for additional progressively more accurate models to use at each verification iteration and determine the appropriate iteration cross-over counts at which to use particular intermediate models.

For example, multiple sets or classes of successively more models may be constructed and calibrated, for example, class 1 and class 2 polynomials as discussed above. The assessment of which of the classes is more efficient to use at a particular iteration of the verification may be made during calibration. The number of terms (e.g. SOCS, density or image trait variable terms) used in the polynomials are associated with an iteration count during the verification phase, according to the invention. Each polynomial of each class is fit to the empirical data. Preferably, during calibration, for a particular number of SOCS kernels appropriate for a given verification iteration, several possible polynomial models may be constructed based on a number of different options, and compared with each other. Some examples of different options for polynomial model construction include, but are not limited to, the use of density kernels or different numbers of density kernels, the use of the reference position versus the target edge position in conjunction with locally accurate polynomials, such as class 2 polynomials, the use of terms like Imax and Imin that require searching along a cutline. Preferably, after calibrating the polynomials constructed using several of such options for a particular simulated iteration, the polynomial is chosen from among those calibrated options that provide simulation results with the best capability of classifying and eliminating from further verification iterations the largest number of features, per unit of computation time expended. A cross-over iteration count may be determined, at which it becomes more efficient to use more the accurate models, e.g. class 1 polynomials, instead of less accurate, but faster to evaluate, models, e.g. locally accurate polynomials, such class 2 polynomials.

A reasonable rule is that if the class 1 polynomials and its inputs take N times longer to evaluate than the class 2 polynomials, then the class 2 polynomials need to conclusively tag at least 1/N times as many features as the class 1 polynomials in order to be the preferred choice in the particular SOCS iteration involved. Typically N would be about 5 or 10; the exact value would be determined during the calibration phase. As noted above, we can expect that the class 2 polynomials will fail to meet this test in late iterations, or at least in the last iteration. The specific crossover point would be determined during calibration. This 1/N rule, though reasonable, is not necessarily perfectly optimal. During calibration one could more generally choose the crossover iteration as the one that minimizes total evaluation time.

To construct each set of intermediate process models, where additional image trait terms and SOCS kernels are to be included at each successive, more accurate, iteration of the inventive printability verification procedure, at least one separate polynomial model would be formed and fit (equivalently, calibrated) to threshold values simulated for a small area of the layout using the maximally accurate model, for example about 0.001% of the chip area. This represents a relatively large number of image fragments, but is feasible since no physical measurements are involved. Each successively more accurate intermediate model would contain new terms corresponding to the limited set of SOCS kernel values that are being used in the intermediate model. The corresponding image trait variables for each intermediate polynomial are computed based on images computed using only the limited set of SOCS kernel values that are used for that model.

At each stage of the calculation, the intensity at each point along a cutline through the fragment in question would be updated by an additional SOCS kernel (or pair of SOCS kernels in the degenerate case). There is additional computational overhead in that the image traits, e.g. Imax and Imin, must be recalculated after each increase in the kernel count, but this overhead is small compared to the basic intensity calculations. Optionally, the polynomial models may be calibrated to features in the test pattern that exhibit catastrophic failures, such as bridging or pinching. For example, calibration may be performed using a least squares fit (modified to avoid overfitting, discussed further below), to excursions of the simulated printed contour from the reference or target position at a particular point or cutline of interest that would indicate a failure. This could be done based on empirically measured printed excursions, or by calibrating the predicted edge placement error to a predetermined large excursion from the reference or target position that would indicate a catastrophic failure. Other suitable methods of calibration now known, or developed in the future, may be used, and the invention is not limited by the method of calibration.

During calibration of the polynomials, it is important to avoid overfitting the model to the empirical data, that is, to fit the empirical data too closely, since empirical data may itself include errors, and may contain systematic effects that the polynomial could not be made to be fully fit as manifested across the complete range of possible images. While a polynomial can often be made to fit such effects in a nominal way when they are present in a limited volume of calibration data, such an overfitted polynomial may exhibit erratic behavior when applied outside the range of the calibration data, resulting in less accurate predictions. There are several approaches to avoiding overfitting, as one skilled in the art would understand. It is important to apply these techniques to models that contain significantly more terms than the standard resist model.

According to one embodiment of the present invention, the polynomials may be constructed to contain terms that are the most strongly predictive combinations of image traits. A method for choosing strongly predictive combinations of traits is forward stepwise regression, which is method typically used in the field of statistics for choosing polynomial terms. Note that other criteria for choosing the terms, along with predictive power, may be used, for example, speed of computation, as discussed elsewhere. The forward stepwise regression method can be used to identify a few additional strongly predictive terms to include in a polynomial that is chosen for fast computation. According to the forward stepwise method, a large number of possible terms are assembled. Then the term which best fits the polynomial is chosen as the first term. Next, one chooses as the 2nd polynomial term that particular term which best fits the error from the first chosen term, and so on. The forward stepwise method may be carried out by using a subset of the calibration data, for example one-half of the data, while testing the behavior of each interim polynomial on the other, set-aside, half of calibration data. As less predictive terms begin to be added (and as the polynomial acquires steadily more degrees of freedom), one will eventually find that the apparent increments in accuracy merely represent fits to noise (the so-called overfitting problem, discussed above); this will manifest itself by a decrease in accuracy when predicting the set-aside data half.

According to a preferred embodiment of the invention, when calibration/training is completed the maximally accurate and intermediate polynomials are stored, along with the standard deviation $\sigma$ of the error, determined during fitting the model to the empirical data, for example, by a least squares method, which provides an estimate of the ability of each polynomial to predict the position of the final contour. The standard deviation $\sigma$ associated with each polynomial may be used to define bands of expected printed contours around the simulated contours computed by the polynomial model. For example, a band having width $\pm 3\sigma$ around the simulated contour would represent the range within which about 99.7% of printed contours would likely to be printed. Smaller or larger bands may be defined, based on the degree of certainty that is appropriate or desired.

From the calibration step one would know for a bias model the uncertainty (e.g. expressed as a standard deviation "sigma") in the predicted position of the final contour. Similarly, for a threshold model one would know the uncertainty in the value of the threshold that is predicted to cut the intensity profile at the position of the final contour, and this can be converted into the uncertainty in contour position by applying the bounding thresholds to the intensity contour.

Class 1 polynomials should preferably include all terms of the standard resist model (except, during early iterations, for large-radius density kernels), it may not be necessary to include all bilinear and quadratic terms involving the individual SOCS kernels. (The same is true of the class 2 polynomials.) For example, one could omit cross-terms and quadratic terms which involve higher SOCS kernels. Cross terms between the SOCS kernels and density kernels could also be omitted.

During calibration, it may be appropriate to compare the performance of a large polynomial containing all linear, bilinear, and quadratic terms with several smaller polynomials in which terms in the above-mentioned categories have been removed. After using the calibration data to simulate processing of a full chip with each of these polynomials, one might choose the smallest polynomial which is capable of completing the simulated operational run using no more than, say, 125% of the time needed to complete the run using the large polynomial.

If the full chip is analyzed by breaking it up into small cells or regions, it would be possible to first calculate the intensities at these nominal edge positions while only later calculating the intensities along the cutlines, without incurring any additional overhead. The sigmas from class 2 polynomials will typically be larger than with the class 1 polynomial models, but if using class 2 polynomials succeeded in removing a significant fraction of the feature edges from further consideration there would be a net gain in throughput, since calculation at the cutline points would usually be avoided.

In OPC simulations, the absolute intensity is not critical, since the process conditions, e.g. exposure dose, are adjusted in order to print a selected critical feature (referred to as the "anchor" feature) at its proper dimensions when the mask is used. To avoid an unnecessary systematic error in the truncated SOCS expansion, the simulated intensity is preferably renormalized, for example, by uniformly multiplying the eigenvalues of the intensity by a common factor that restores the intensity of an anchoring feature or open frame (i.e., a mask that is entirely bright) to the value provided by the maximally accurate model. Alternatively, the calibrated models may be used to correct this error, but renormalization with an anchoring feature is more exact and is preferred.

D. Iterative Verification

Figure 4:
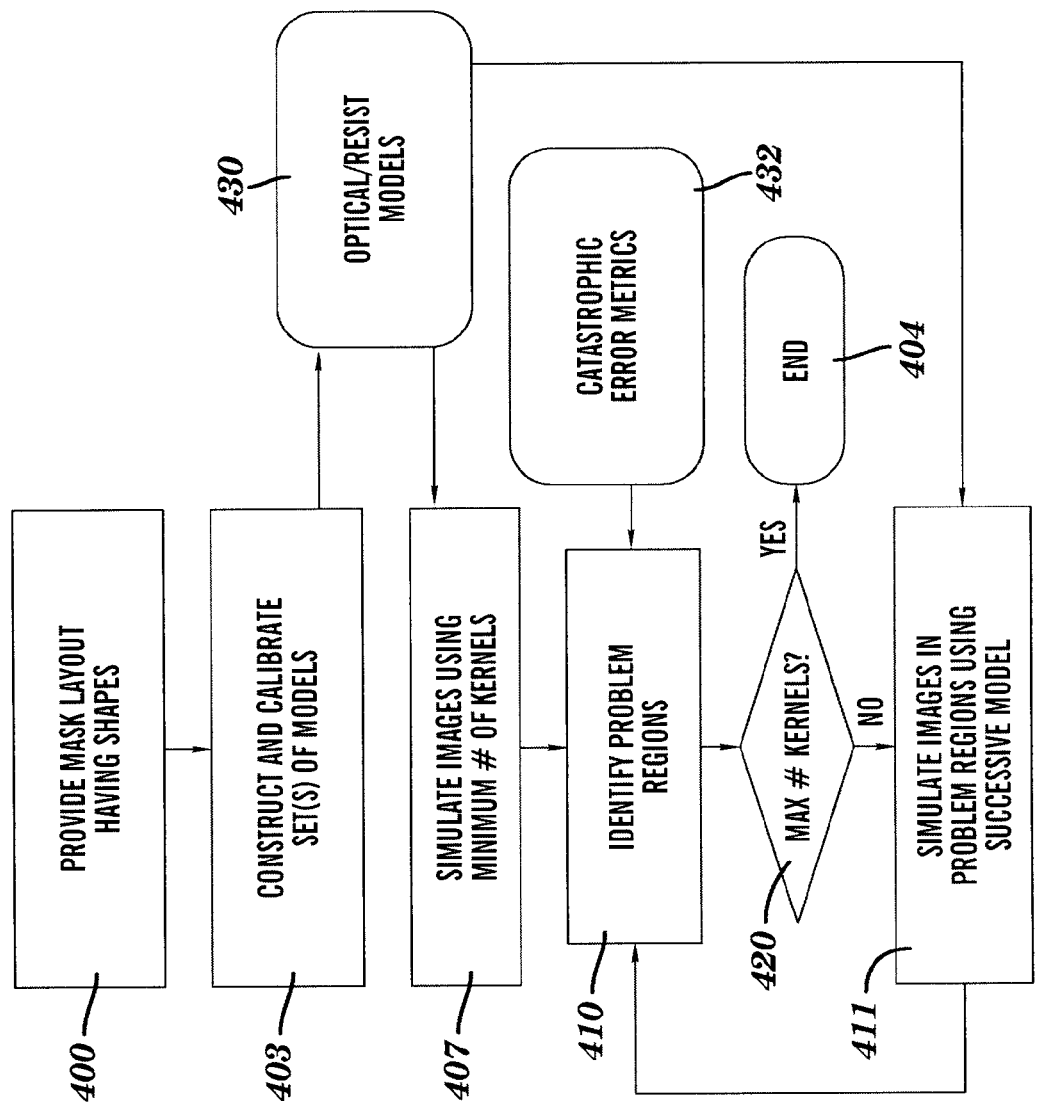
FIG. 4 illustrates a flow chart of an embodiment of the inventive verification procedure.
Figure 5:
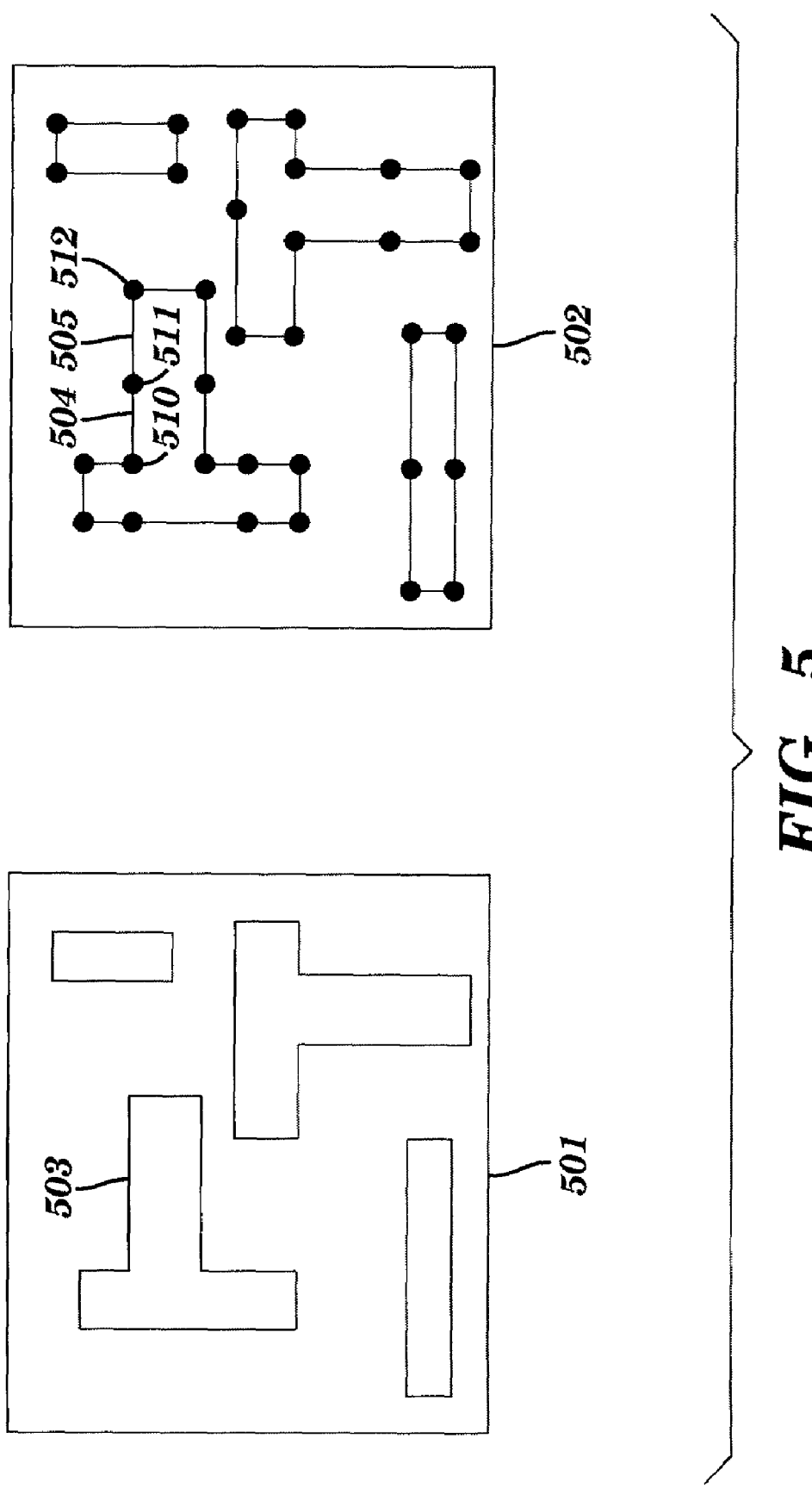
FIG. 5 illustrates a mask layout and a fragmented version of the mask layout.

One embodiment of the inventive iterative verification methodology is described, with reference to FIG. 4. A mask layout is provided (Block 400), and a set of n=1, . . . N successively more accurate models is constructed and calibrated (Block 403), as discussed above, where each set n corresponds to an increasing number of SOCS kernels, k=1, . . . , K, used in the optical model. Note that the number of SOCS kernels corresponding to each n model need not increase linearly. For example, for set n=1, the SOCS kernels k=1 may be used. However, for polynomial set n=2, SOCS kernels k=1, 2 and 3 may be used, and for polynomial set n=3, SOCS kernels k=1, . . . , 6 may be used. However, the invention is not so limited, and any appropriate set of SOCS kernels may be associated with a model n, such that the nth model is more accurate than the n−1 model. The successive accuracy of the models may be determined by any appropriate means, such as during calibration. The calibrated progressively accurate optical and resist models are preferably retained for later usage (Block 430).

For each verification iteration n, the simulated printed contours are simulated using the nth intermediate accuracy optical and variable resist models, where, for example, the nth intermediate accuracy variable threshold resist process model uses the same number of SOCS kernels used in the intermediate accuracy optical model. The intersection of the nth simulated threshold model and the nth optical image provides the simulated, expected, printed contours. Alternatively, the resist threshold model may be a bias model that directly simulates the position of the printed contour.

An initial verification iteration is performed using an intermediate accuracy model, using a minimum set of SOCS kernels and image traits, if any (Block 407). One or more catastrophic error metrics 432 are provided. For identification of catastrophic errors based on excessive light, such as SRAF printing errors, side lobe errors and bridging errors, a bright field simulation of the mask layout is performed. For identification of catastrophic errors based on insufficient light, such as necking or pinching errors, or catastrophic line-shortening overlay errors, a dark field simulation of the mask layout is performed.

The resulting simulated contours or contour bands are examined to identify any critical regions whose contours violate one or more of the catastrophic error metrics 432, and indicate potential catastrophic errors (Block 410). Critical regions where the contours or contour bands indicate that there are no catastrophic errors, may be identified as having passed verification, and eliminated from further verification iterations. Critical regions where the contours or contour bands indicate possible catastrophic errors are flagged for additional verification using a more accurate model in the next verification iteration. A more accurate intermediate model is selected from the calibrated model sets (Block 430) and then used to simulate contours or contour bands for the flagged problem regions (Block 411). In a preferred embodiment, class 1 and class 2 intermediate variable threshold models have been constructed and calibrated, and the initial verification iterations will preferably be performed using class 2 models, and when the verification iteration count reaches a predetermined cross-over value, the algorithm may switch from class 2 to class 1 polynomial models. The step of identifying problem regions (Block 410) is repeated using progressively more accurate models until the maximum number of terms or kernels are used, i.e. the maximally accurate model is reached (Block 420). When the maximally accurate model is used, any remaining catastrophic errors are then reported for appropriate corrective action (Block 404).

Figure 6:
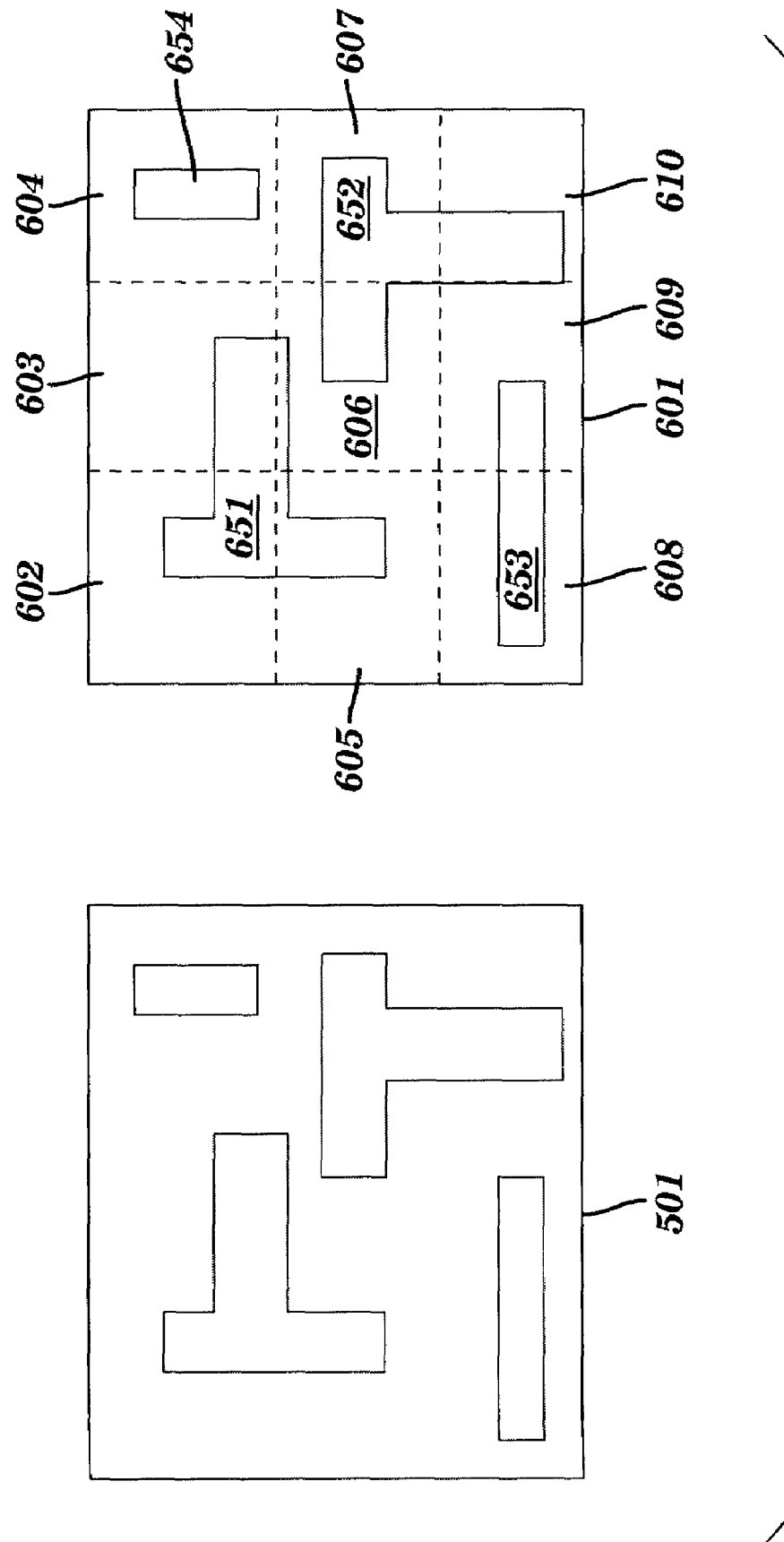
FIG. 6 illustrates a mask layout divided into partitions.

The optical image simulation for a particular point of interest may be performed according to methods now known or developed in the future, for example, by computing the intensity at evaluation points associated with and representing edge fragments of mask layout features. For example, referring to FIG. 5, a portion of a mask layout 501 is illustrated, including a mask feature 503. The mask layout is typically discretized for simulation, for example, by fragmentation of the polygon mask shapes, as in the fragmented layout 502. The endpoints of edge fragments are defined by nodes, for example, feature 503 includes fragment 504 defined by nodes 510 and 511, and fragment 505 defined by nodes 511 and 512. Simulation of the intensity of the image associated with each mask fragment is typically performed at an evaluation point (not shown) on a fragment. The turnaround time of the computation may often be improved by subdividing the mask layout into smaller regions (subregions) or partitions, and performing the simulation of each optical image independently, for example, on separate computers or processors, as on a parallel or distributed computer system. For example, FIG. 6 illustrates the mask layout 501, divided into several regions 602-610. The shape of the subregions 602-610 need not be limited to rectangular shapes, but may be non-rectangular, and need not be uniform in size. Since each subregion or partition will be computed independently of each other, each partition must also be associated with a region of optical influence or region of vicinity at the boundary of the partition, so as to ensure the simulation of images near the partition boundary takes into account the influence of features that are within a distance of the parition's boundary that may exert significant optical influence on features within the partition that are near the boundary of the partition. The region of vicinity, or context region, is typically defined as a band around the mask subregion, having a width that is typically defined by the largest radius of optical influence of the SOCS kernels and other terms used in the simulation. The width of the band (context region) is defined as the maximum radius of optical influence among all the optical kernels and other image traits used in the optical and resist models.

The shapes within the region of vicinity are taken into consideration when computing the simulated wafer image within each partition. This is demonstrated with reference to FIG. 7. The partition 602 from the partitioned layout 601 is illustrated, including the associated region of vicinity (context region) 701 that surrounds the region 602 and partially overlaps into partitions 603 and 605 (see FIG. 6). The shape 651 extends beyond the partition 602 into partitions 603 and 605. The portion of shape 651 that is within partition 602 is shown in hatched line as shape 751. Any shape that is within the context region 701, such as the shape portion 761, or any other shape within the context region 701, will be considered during simulation for printability verification within partition 602.

Figure 7:
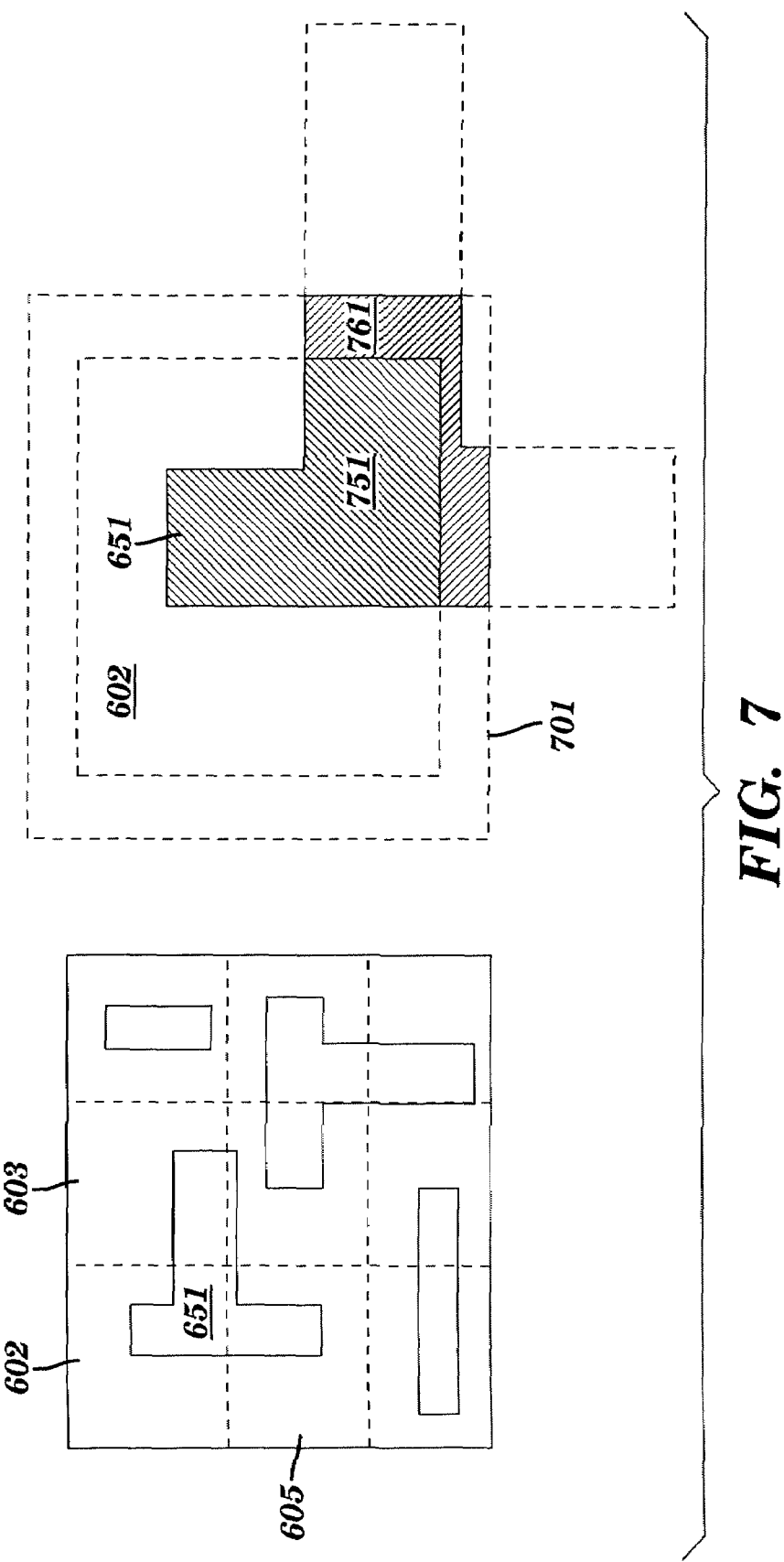
FIG. 7 illustrates a partition of a mask layout used for simulating the image for that partition.
Figure 8:
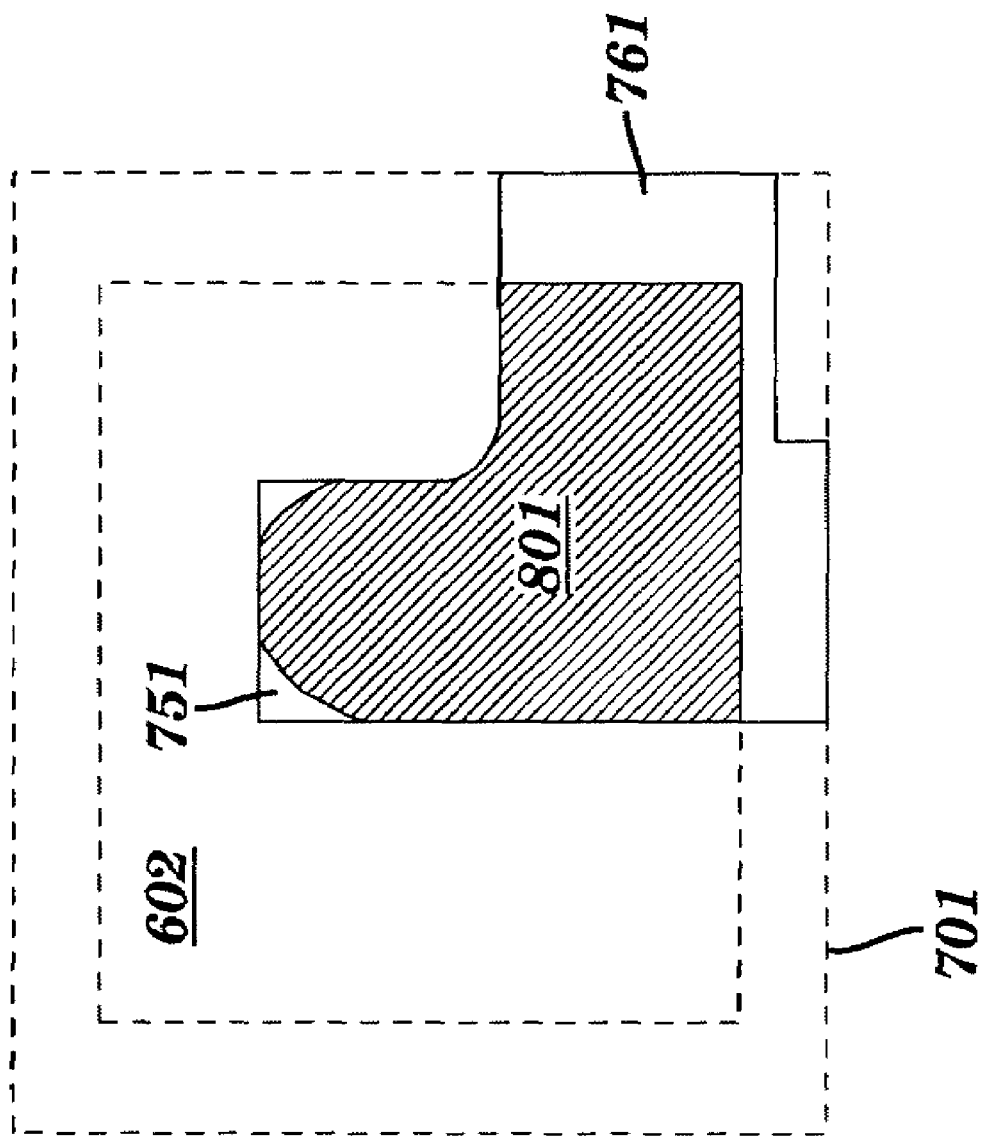
FIG. 8 illustrates a simulated contour for the shape in the partition of FIG. 7.

FIG. 8 illustrates the partition 602 as demonstrated in FIGS. 6 and 7 after a first verification iteration. The portion of the mask shape 751 image is simulated using the k=1 SOCS kernel, including the influence of any shapes within the context region 701, e.g. shape 761. The simulated contour 801 (e.g. for a bright field mask) is determined by the intersection of the variable threshold computed using an intermediate accuracy variable resist model derived from an optical image using the k=1 SOCS kernel. The verification rules indicate that the image contour 801 computed using the k=1 SOCS kernel does not include any features that would fail catastrophically, for example, there are no other mask shapes sufficiently near mask shape 751 that would cause bridging with the contour 801. Since the use of the k=1 SOCS kernel provides a conservative simulation of the contour 801 such that using a more accurate model would predict that the printed contoured shape for mask shape 751 would have smaller widths than that of contour 801, in accordance with the inventive procedure, the partition 602 will be classified as error-free (Block 420). Hence the region 602 will be eliminated from further verification iterations. In this example, subregions 603, 604, 605, 607, 608, 609, 610 of layout 601 (FIG. 6) can be also exempted from further verification iterations in a similar manner. The methodology of exempting these regions is similar to that what is demonstrated for region 602 using FIGS. 7 and 8. They are not further elaborated here for the sake of brevity.

On the other hand, subregion 606 cannot be exempted from further verification iterations based on the simulated contours using the minimally accurate models, i.e. using a single SOCS kernel for the optical and variable resist models. This is further explained using FIGS. 9-13.

Figure 9:
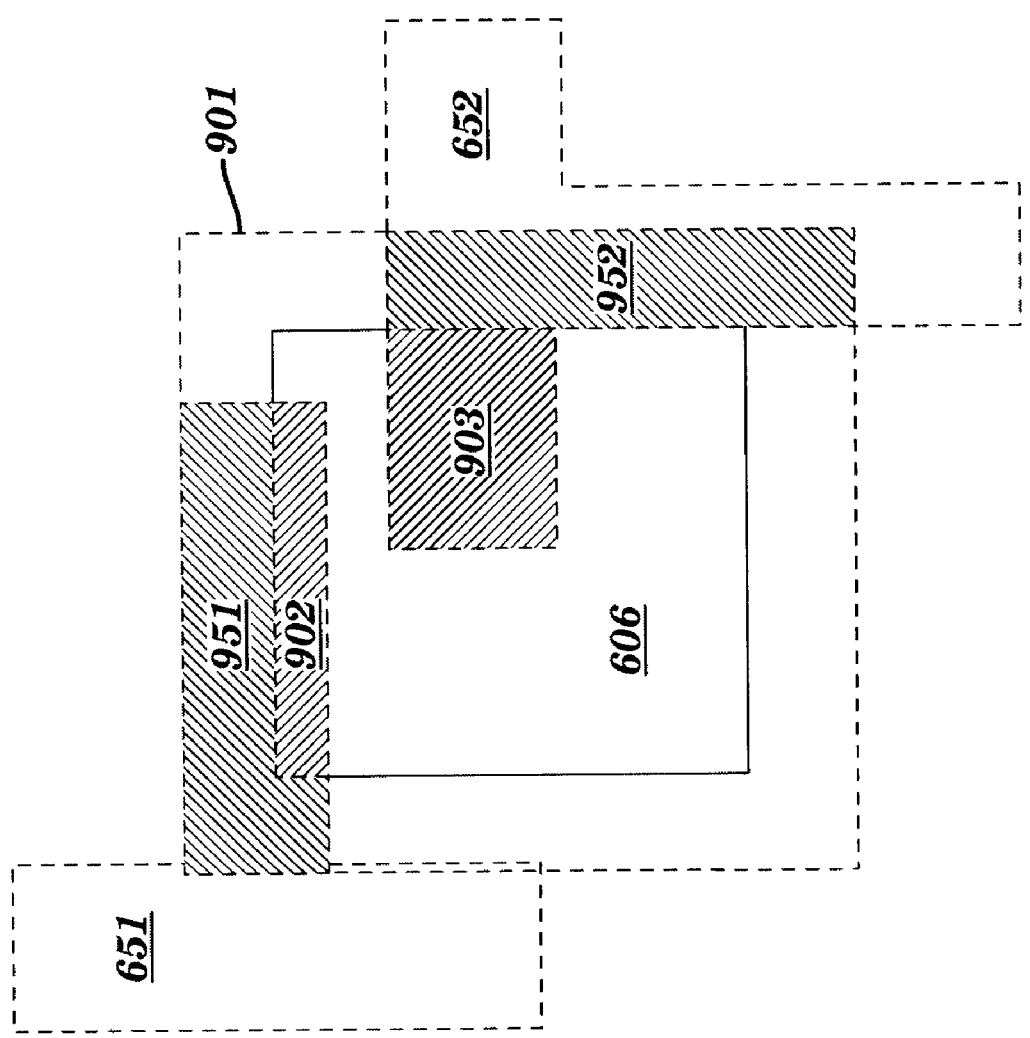
FIG. 9 illustrates another partition of the mask layout.

FIG. 9 shows region 606 (FIG. 6). Region 606 contains portions of two mask shapes 651 and 652, respectively. The region of vicinity 901 for the partition 606 is the region between the boundary of partition 606 and the dashed line 910 enclosing partitioned subregion 606. The portion of mask shape 651 contained within region 606 is shown as shaded region 902. The portion of mask shape 652 contained within region 606 is shown as shaded region 903. The portion of mask shape 651 contained within the region of vicinity 901 is shown as shaded region 951. The portion of mask shape 652 contained within the region of vicinity 901 is shown as shaded region 952.

Figure 10:
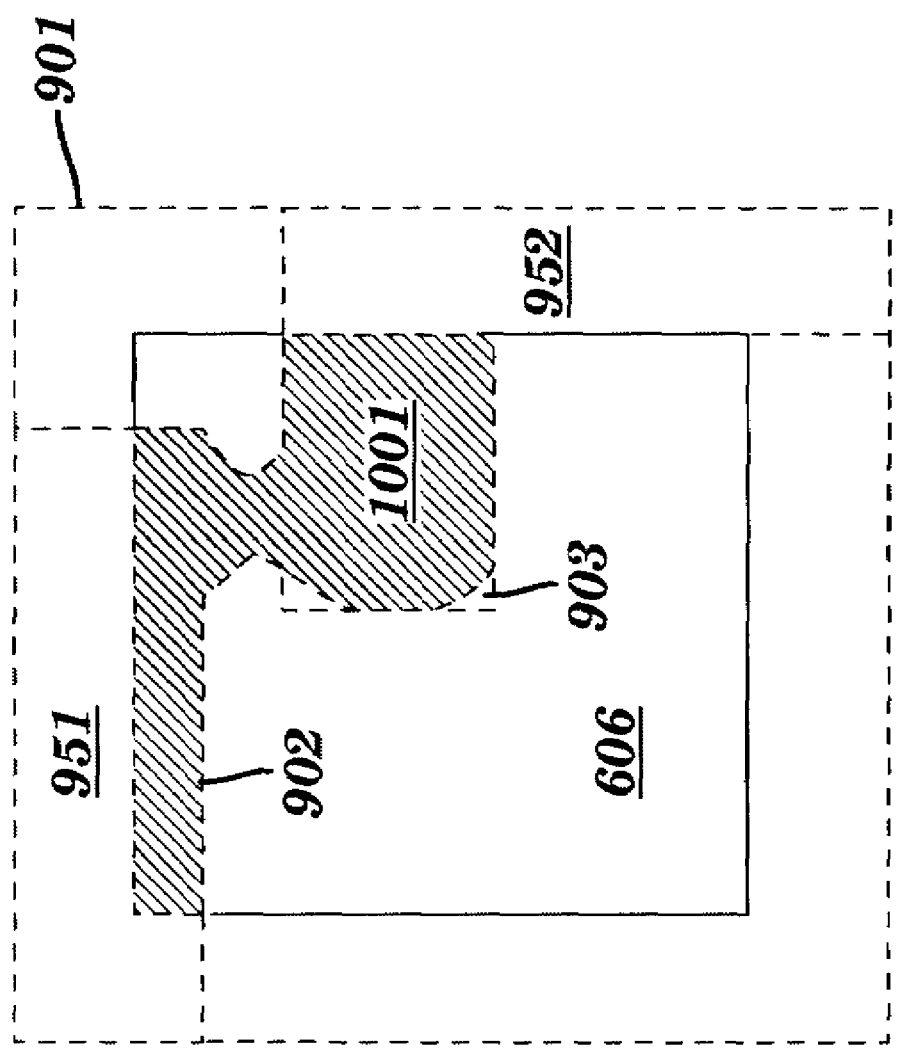
FIG. 10 illustrates simulated contours for the partition of FIG. 9, illustrating a potential catastrophic error during one verification iteration of an embodiment of the invention.

Referring to FIG. 10, during the first (i.e. n=1) verification iteration (Block 410), the expected contours corresponding to shapes 902 and 903 are simulated with the intersection of the optical and variable threshold models using the k=1 SOCS kernel, and the resist threshold model may be a class 2 polynomial comprising local image traits. The result of the simulation is a single resulting contour enclosing region 1001. The single contour region 1001 shows that the simulated printed wafer features corresponding to the original mask shapes 651 and 652 (FIG. 6) may have a tendency to bridge or short based on a conservative, k=1 SOCS kernel model. Therefore, in accordance with the invention, using a bright field simulation, the region 606 will be classified as a partition that may include catastrophic errors (Block 420 of FIG. 4), and cannot be eliminated from further verification iterations using a more accurate set of models (Block 411 of FIG. 4).

Figure 11:
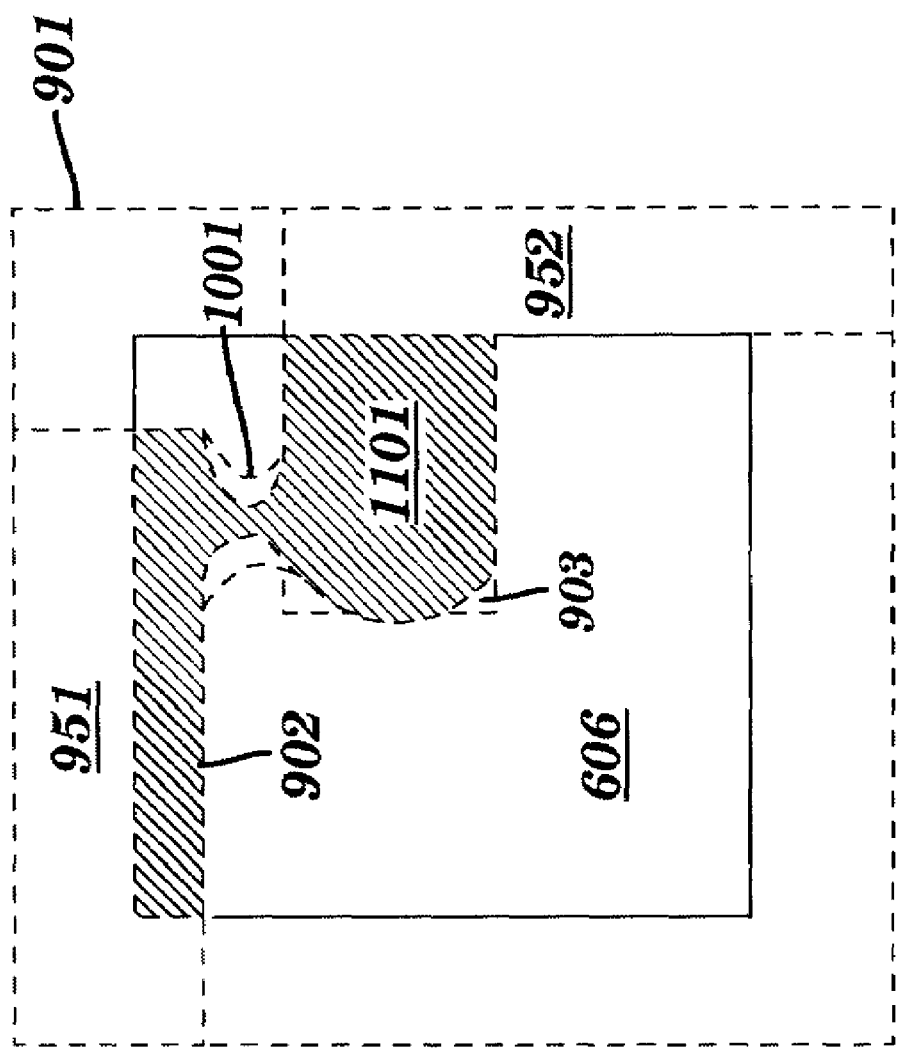
FIG. 11 illustrates simulated contours for the partition of FIG. 9, illustrating a potential catastrophic error during another verification iteration of an embodiment of the invention.
Figure 12:
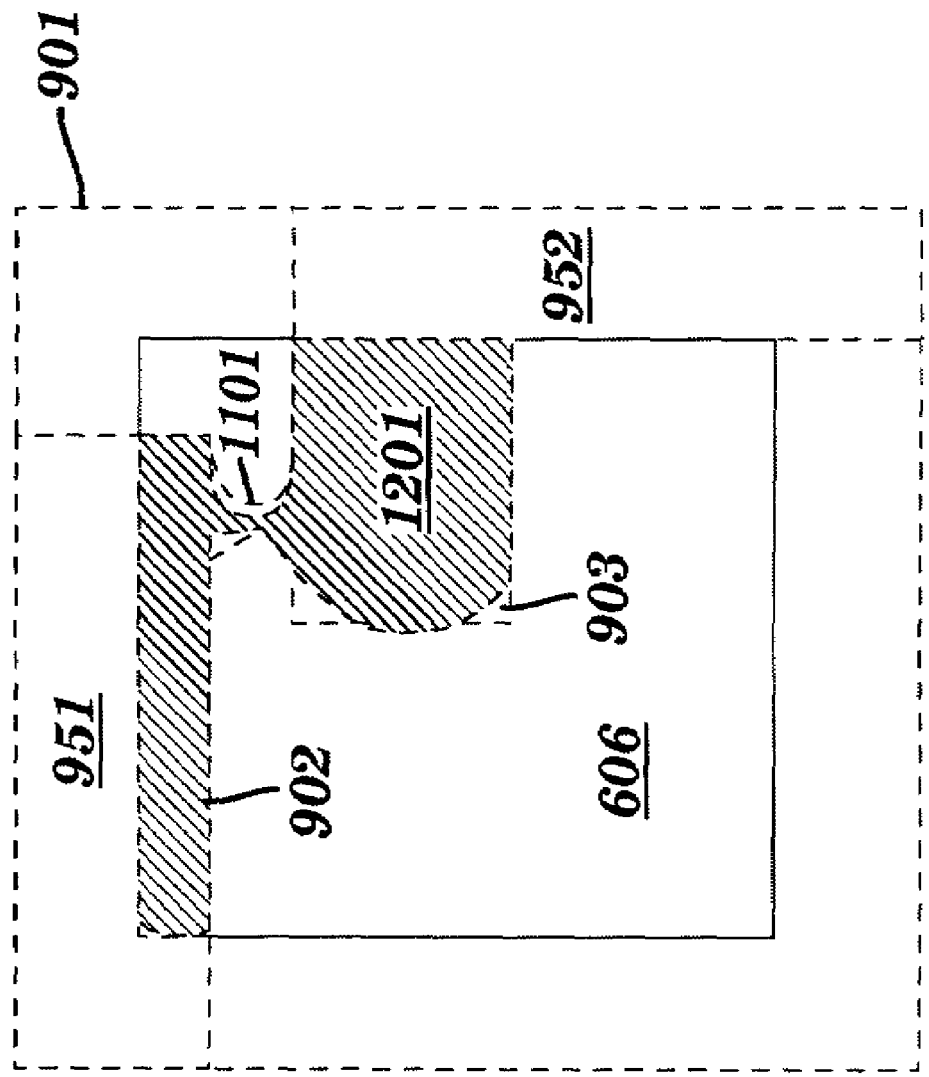
FIG. 12 illustrates simulated contours for the partition of FIG. 9, illustrating a potential catastrophic error during a third verification iteration of an embodiment of the invention.

In the subsequent n=2 verification iteration (Block 410), within the layout portion 601, only partition 606 needs to be evaluated. Referring to FIG. 11, mask shapes 902 and 903 are simulated using the n=2 set of optical and threshold resist models. For example, the n=2 models may use SOCS kernels k=1, 2 and 3, while the resist polynomial model may comprise a class 1 polynomial that includes additional, nonlocal image traits. The resulting contour encloses the shaded region 1101. The n=2 expected contoured region 1101, although it is more narrow than the n=1 expected contoured region 1001 (FIG. 10), still suggests that the simulated wafer regions corresponding to the original mask shapes 651 and 652 (FIG. 6) may have a tendency to bridge or short. Thus, the inventive verification method would classify this region as including a possible excessive light catastrophic error (Block 420 of FIG. 4) and will investigate this region using models with more accuracy and more optical kernels (Block 411 of FIG. 4). Note that in this example, from the layout portion 601 of FIG. 6, only partition 606 is required to undergo verification iterations beyond n=1, thus resulting in significant savings in computation, from avoiding the additional verification iterations for partitions 601-605 and 607-610, but also from taking advantage of the relatively faster simulation time required by using the n=1 optical and resist threshold models based on a small number of SOCS kernels and a small number of image traits in the polynomial model.

The verification may then proceed with a subsequent, n+1 iteration (Block 410 of FIG. 4), for example, using optical and resist threshold models based on k=1 through 6 SOCS kernels. The resulting expected contour corresponding to mask shapes 902 and 903 (original mask shape 651 and 652 of FIG. 6, respectively) is shown enclosing shaded region 1201. The expected n=3 contour is narrower than the n=1 or n=2 contours, but still indicates that the printed wafer images corresponding to the original mask shapes 651 and 652 (FIG. 6) may have a tendency to bridge or short, and again would classify partition 606 for further verification iterations (Blocks 420 and 411 of FIG. 4), using more accurate optical and resist threshold models.

Figure 13B:
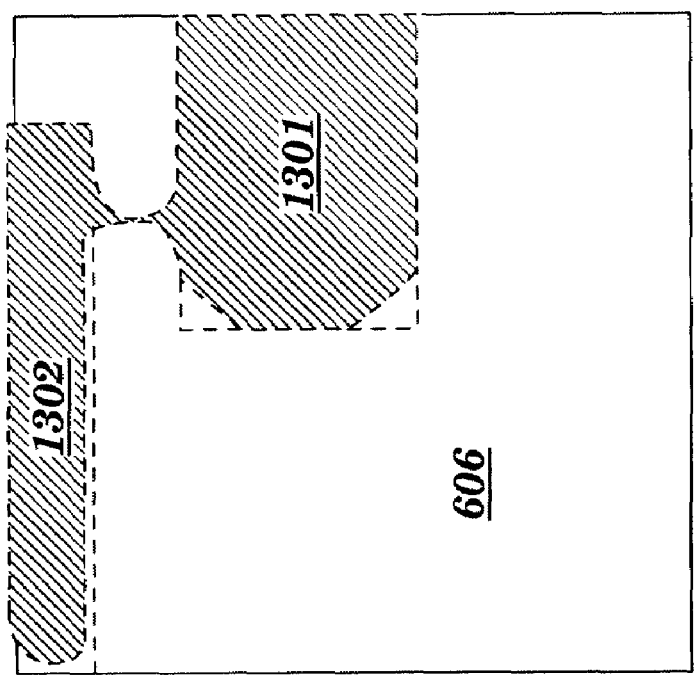
FIG. 13 illustrates simulated contours for the partition of FIG. 9, illustrating a potential catastrophic error during yet another verification iteration of an embodiment of the invention.
Figure 13A:
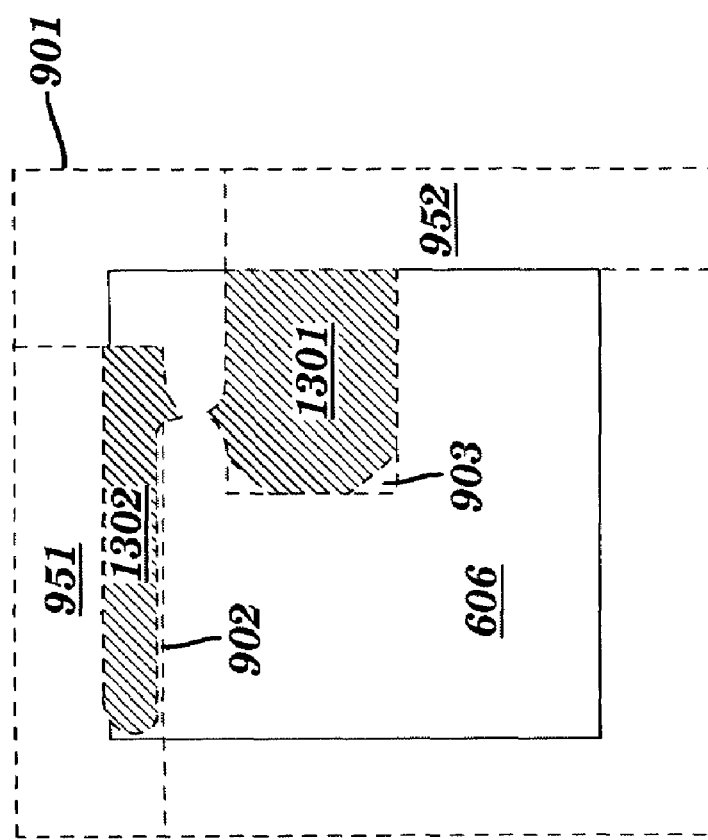

The verification iterations will proceed while there are further partitions or regions to verify, until n=N, when the maximally accurate models are used, for example, k=1 . . . 15. Referring to FIG. 13A, in this example, using the maximally accurate optical and variable threshold models, the contours 1302 and 1301 are simulated, corresponding to mask shapes 902 and 903 within the partition 606. In this example, referring to FIG. 13B, the two contours 1302 and 1301 are separated by a distance that is within the minimum distance that would indicate a bridging or pinching error. Therefore, the likelihood of a catastrophic error still exists within region 606, and it is then marked as an error containing region and the exact location of the error is reported.

To understand the computational advantage of the inventive verification method, for illustration purposes, a reasonable assumption may be made, assuming that the average radii of the kernels is uniform, that simulation time for each of the SOCS kernels is about the same. This means that simulating with 12 SOCS kernels will take 12 times longer than simulation using a single kernel. For the sake of simplicity it is assumed that each region has the same number of segments to be simulated. Suppose there are X number of segments in each region and it takes Y sec to simulate a single edge using a single kernel. In a conventional verification methodology, if a total of 15 kernels were used for simulation, each region or partition would take 15XY sec for simulation, and for nine regions it would take 135XY sec for the simulation. In the example above, only region 606 (FIG. 6) was simulated using 15 SOCS kernels in the maximally accurate model. The other eight regions 602, 603, 604, 605, 607, 608, 609 and 610 were simulated using a single kernel, namely the k=1 SOCS kernel, which would require 8XY sec. The region 606 was first simulated using models based on the k=1 SOCS kernel, then based on k=1-3 kernels, followed by k=1-6 kernels and ultimately with k=1-15 kernels, totaling (XY+3XY+6 XY+15 XY) sec. Therefore, the time required for the verification procedure according to the present invention for the partitioned layout 601 of FIG. 6 would be 8XY+(XY+3XY+6XY+15XY) =33XY sec. Therefore the verification of the mask layout 601 using the inventive procedure would be about 4 times faster than verification using the conventional method.

In a more realistic case, one may expect that about 90% of the regions may be exempted from further verification after simulation based on models using a single kernel. For the remaining partitions, 6% may be exempted after using models based on k=1-3 kernels and 3% may be exempted after using k=1-6 kernels and only about 1% of the partitions may require detailed simulation using the maximally accurate models based on the maximum number of kernels. Using the assumption that the verification computation time is proportional to the number of kernels used in the above example, the inventive verification methodology would be about 882% faster than a verification method that uses models based on the maximum number of kernels, as is conventionally done.

According to another embodiment of the invention, bands of expected printability may be defined around the expected contours, having widths equal to some multiple of the standard deviation $\sigma_n$ determined for the nth model during calibration, for example, $\pm 3\sigma_n$.

Figure 14:
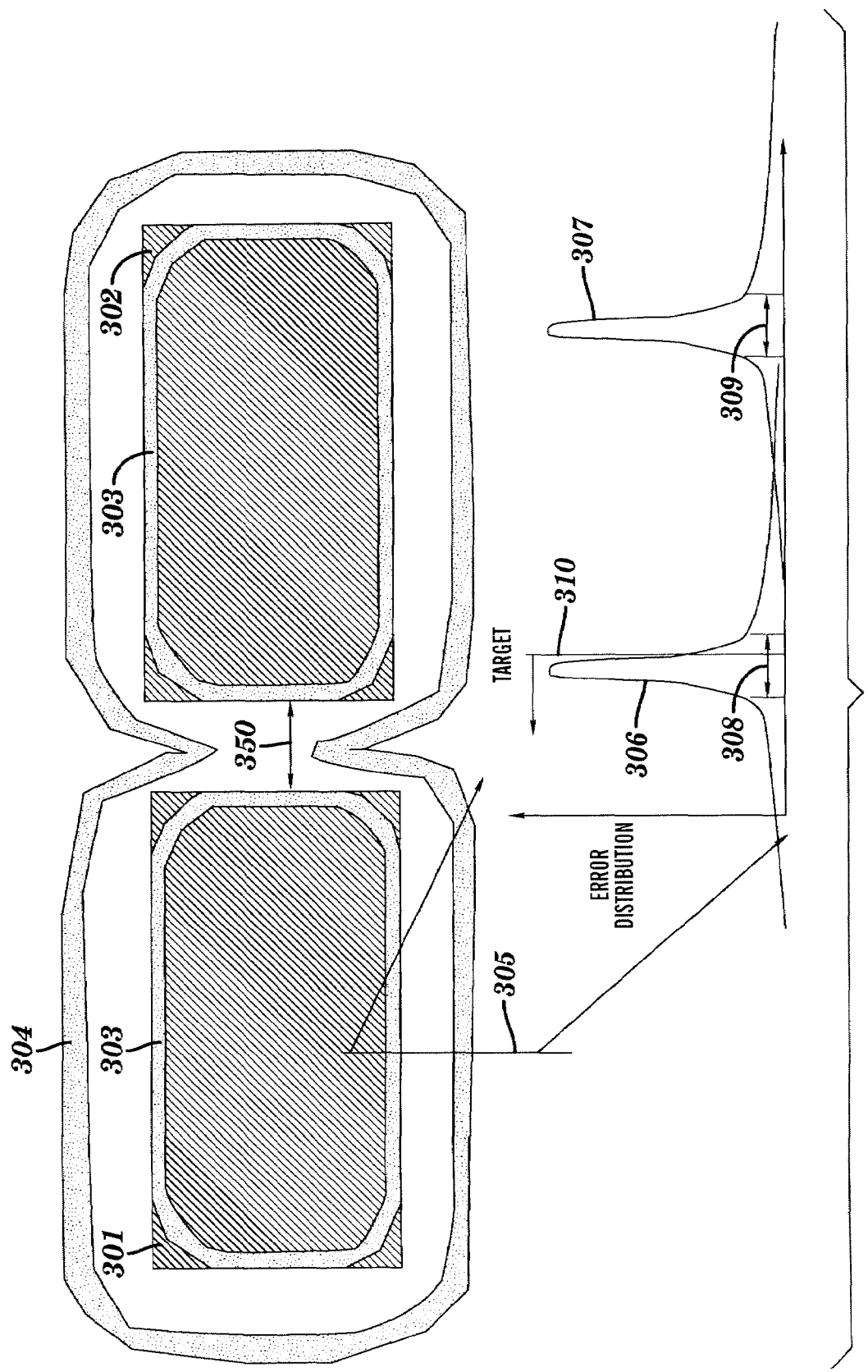
FIG. 14 illustrates simulated contours including confidence bands, according to another embodiment of the invention.

According to a preferred embodiment, a band defined by a multiple of the standard deviation (e.g. $\pm 3\sigma$) defines a region within which the features are likely to print with a high degree of confidence, even in the presence of process variability across the chip. For example, FIG. 14 illustrates a top view of two mask shapes 301 and 302, with a distance 350 between these two shapes. Superimposed on the mask shapes 301 and 302 are contours of corresponding simulated printed images for a bright field simulation of the mask on a wafer. If the minimum distance between the wafer image contours at the location corresponding to the distance 350 between the mask shapes 301 and 302 is less than a certain user defined parameter, the printed shapes are considered to be bridged on the wafer. If process variations are taken into consideration, it is possible to compute a band of contours that provide a range of possible contours within a desired statistical variation of process conditions, for example, within 3-sigma variation of nominal process conditions. The simulated intensity error distributions are plotted in FIG. 14 along a cut line 305. The target shape 310 corresponding to mask shape 301 is illustrated in profile. The error distribution 307 is computed with fewer than the maximum number of kernels and the 3-sigma region 309 corresponds to the 3-sigma contour band 304 computed with fewer than the maximum number of kernels. The error distribution 306 is computed with the maximum number of kernels and the 3-sigma region 308 corresponds to the 3-sigma contour band 303 computed with the maximum number of kernels. If fewer than the maximum number of kernels are used, the corresponding 3-sigma process variation band 304 suggests that there may potentially be a bridging error on the wafer at the position corresponding to the space 350 between mask shapes 301 and 302. In accordance with the present invention, the image contour bands associated with the potential bridging error at location 350 will then be re-computed using additional kernels, and evaluated again for potential errors. In this example, as additional kernels are added, the 3-sigma band 303 computed with the maximum number of kernels shows that the images corresponding to the mask shapes 301 and 302 will not bridge on the wafer at the space 350, even in the presence of 3-sigma process variations. As more kernels are added to the computation, if the absence of a bridging error is detected, the space 350 can be eliminated as a bridging error problem without having to perform additional simulations.

According to a preferred embodiment, a region of catastrophic failure may be defined such that if any expected contours, or the band of certainty around the expected contour, e.g. a ±3σ band, encroaches the region of catastrophic failure, then that contour, or band of contours, will be deemed to indicate an error, and the partition or subregion contain such an error would be identified for continued verification iterations, or otherwise identified as including an error condition (Block 420). Catastrophic Errors are defined as errors in the mask design because of which the circuit may fail to function at all if any of these errors would occur. Examples of such errors are pinching and necking/bridging errors as described by regions 161 and 162 using FIG. 1A. From the mask simulation perspective they refer to significantly large excursions of the simulated contours from their nominal positions so that the spacing (in case of bridging) or width (in case of necking) violates a predefined metric. If the band created by the mean±3σ contours violate the predefined metric the region is flagged as an error. Similarly if the band created by mean±3σ contours do not violate the predefined metric the region is deemed is not flagged as an error. However, if part of the band created by the mean±3σ contours violate the predefined metric then the result is deemed uncertain more iterations are carried out to make a decision on this region.

Figure 15:
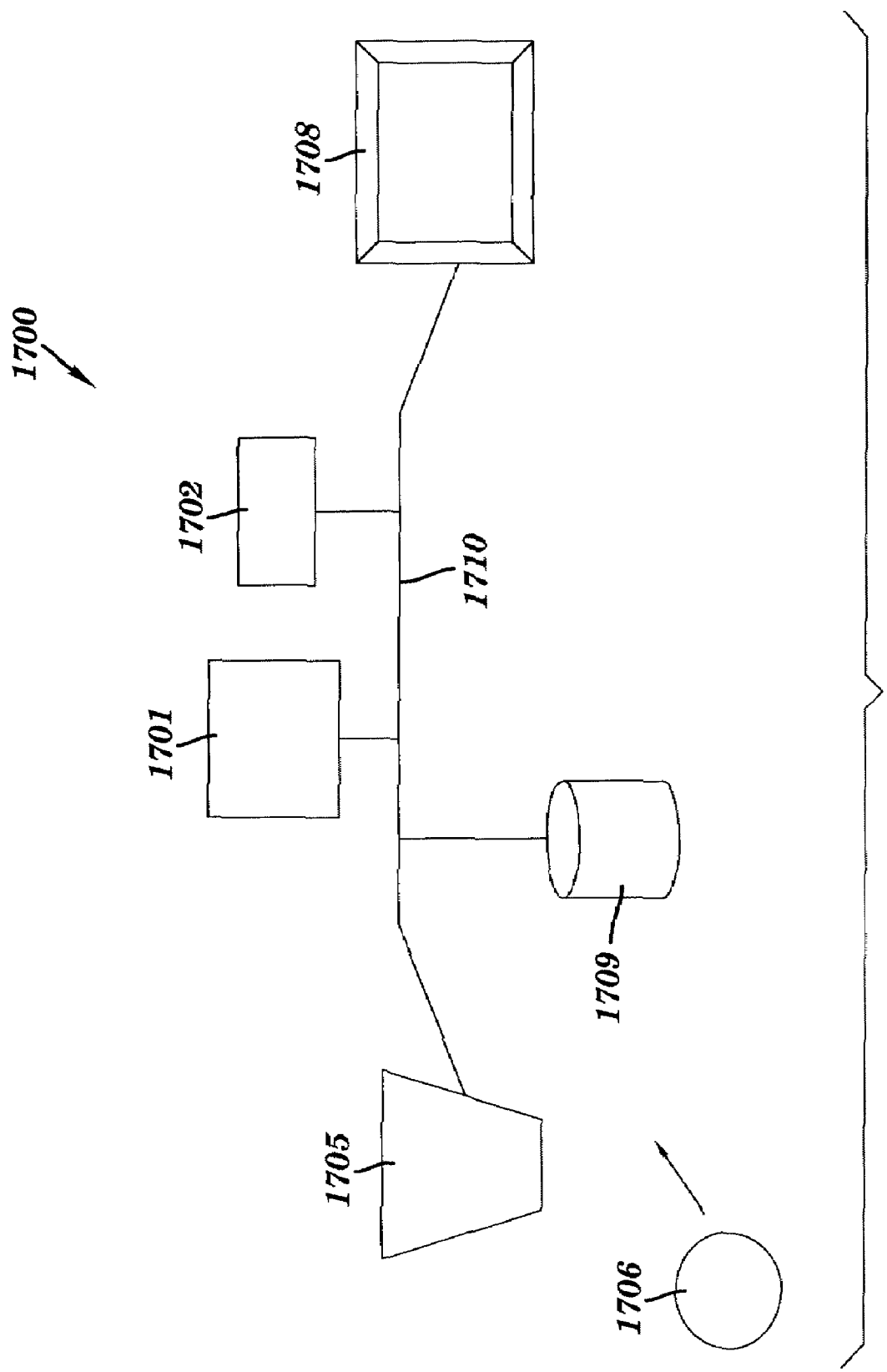
FIG. 15 illustrates a computer system and program product for performing the method according to another embodiment of the invention.

In one embodiment of the present invention, referring to FIG. 15, the verification method is implemented in a digital computer 1700, having components including, but not limited to: a central processing unit (CPU) 1701, at least one input/output (I/O) device 1705 (such as a keyboard, a mouse, a compact disk (CD) drive, and the like), a display device 1708, a storage device 1709 capable of reading and/or writing computer readable code, and a memory 1702, all of which are connected, e.g., by a bus or a communications network 1710. The present invention may be implemented as a computer program product stored on a computer readable medium, such as a tape or CD 1706, which may be, for example, read by the I/O device 1705, and stored in the storage device 1709 and/or the memory 1702. The computer program product contains instructions to implement the method according to the present invention on a digital computer, as shown in FIG. 4. The invention can take the form of an entirely hardware embodiment, and entirely software embodiment or an embodiment containing both hardware and software elements. In a preferred embodiment, the invention is implemented in software, which includes, but is not limited to firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus, device or element that can contain, store, communicate, propagate, or transport the program for use by or in connection with the computer or instruction execution system. The medium can be an electronic, magnetic, optical, electromagnetic, infrared, or semiconductor storage medium, network or propagation medium. Examples of a storage medium include a semiconductor memory, fixed storage disk, moveable floppy disk, magnetic tape, and an optical disk. Current examples of optical disks include compact disk—read only memory (CD-ROM), compact disk—read/write (CD-R/W) and digital video disk (DVD). The present invention may also be implemented in a plurality of such a computer or instruction execution system where the present items may reside in close physical proximity or distributed over a large geographic region and connected by a communications network, communicating through a propagation medium via communication devices, such as network adapters. Examples of a network include the Internet, intranet, and local area networks. Examples of a propagation medium include wires, optical fibers, and wireless transmissions. Examples of network adapters include modems, cable modems, ethernet cards and wireless routers.

In another embodiment of the present invention, the method according to the invention, for example, as in FIG. 4, may be provided as a service to a mask designer, to identify portions of the mask layout where catastrophic errors may result when printed on the wafer. In addition, the intermediate models according to the present invention may be used in a service offering to provide early predictions of catastrophic errors in the design to a designer. Some of the characteristics of such models used for early catastrophic error prediction during the design phase that are desired include convergence with sufficiently high confidence, e.g. with 3σ accuracy, monotonic accuracy, e.g. with 3σ accuracy, it must be sufficient to detect yield and performance detractors, provides fast simulation time, and may be extended to more accurate models if and when more information about the process becomes available, which are met by intermediate models according to the present invention.

It is understood that the order of the above-described steps is only illustrative. To this extent, one or more steps can be performed in parallel, in a different order, at a remote time, etc. Further, one or more of the steps may not be performed in various embodiments of the invention.

It is understood that the present invention can be realized in hardware, software, a propagated signal, or any combination thereof, and may be compartmentalized other than as shown. Any kind of computer/server system(s)—or other apparatus adapted for carrying out the methods described herein—is suitable. A typical combination of hardware and software could be a general purpose computer system with a computer program that, when loaded and executed, carries out the respective methods described herein. Alternatively, a specific use computer, containing specialized hardware for carrying out one or more of the functional tasks of the invention could be utilized. The present invention also can be embedded in a computer program product or a propagated signal, which comprises all the respective features enabling the implementation of the methods described herein, and which—when loaded in a computer system—is able to carry out these methods. Computer program, propagated signal, software program, program, or software, in the present context mean any expression, in any language, code or notation, of a set of instructions intended to cause a system having an information processing capability to perform a particular function either directly or after either or both of the following:

(a) conversion to another language, code or notation; and/or (b) reproduction in a different material form. Furthermore, it should be appreciated that the teachings of the present invention could be offered as a business method on a subscription or fee basis. For example, the system and/or computer could be created, maintained, supported and/or deployed by a service provider that offers the functions described herein for customers. That is, a service provider could offer the functionality described above.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of verifying a lithographic mask, the method comprising the steps of:
   providing a mask layout;
   providing a catastrophic error metric;
   providing a plurality of image models, wherein said plurality of image models comprises a plurality of kernels ranked according to decreasing image contribution;
   simulating an image for said mask layout using at least one of said plurality of image models comprising a first subset of said plurality of kernels;
   identifying a violation of said catastrophic error metric in said simulated image;
   identifying a portion of said mask layout corresponding to said simulated image that includes said violation; and
   simulating a next image for said portion of said mask layout using a next of said plurality of image models comprising a second subset of said plurality of kernels comprising said first subset of said plurality of kernels and at least an additional one of said plurality of kernels having less image contribution than said kernels of said first subset.

2. The method of claim 1 further comprising repeating said steps of identifying a violation of said catastrophic error metric in said simulated image, identifying a portion of said mask layout corresponding to said simulated image that includes said violation, and simulating a next image for said portion of said mask layout, wherein each step of simulating a next image uses a next of said plurality of image models having greater accuracy than said at least one image model used in the prior step of simulating, until said violation is identified for said simulation image using a maximally accurate of said plurality of image models.

3. The method of claim 2 further comprising providing identifying a plurality of violations of said catastrophic error metric in said simulated image, and identifying a plurality of portions of said mask layout corresponding to portions of said simulated image comprising said plurality of violations, and simulating a next image for said plurality of portions of said mask layout.

4. The method of claim 3 further comprising identifying a portion of said next simulated image wherein no violations of said catastrophic error metric occur and removing said corresponding portion of said plurality of portions of said mask layout from further simulation steps.

5. The method of claim 1 wherein said plurality of image models comprises a SOCS model.

6. The method of claim 1 wherein said plurality of image models comprises a resist model.

7. The method of claim 6 wherein said resist model comprises a polynomial.

8. The method of claim 7 wherein said polynomial comprises a class 1 polynomial.

9. The method of claim 7 wherein said polynomial comprises a class 2 polynomial.

10. The method of claim 1, wherein said plurality of image models comprises a class 1 polynomial and a class 2 polynomial, and wherein said step of simulating an image comprises using said class 2 polynomial, and wherein said step of simulating a next image comprises using said class 1 polynomial.

11. The method of claim 1 wherein said violation is selected from the group consisting of a bridging error, a side-lobe printing error, an SRAF printing error, a necking error and a line-end shortening overlay error.

12. The method of claim 1 wherein said violation comprises an excessive light error, and said simulation comprises a bright field simulation.

13. The method of claim 12 wherein said violation is selected from the group consisting of a bridging error, a side-lobe printing error and an SRAF printing error.

14. The method of claim 1 wherein said violation comprises an insufficient light error, and said simulation comprises a dark field simulation.

15. The method of claim 14 wherein said violation is selected from the group consisting of a necking error and a line-end shortening overlay error.

16. The method of claim 1 wherein said simulated images comprises bands of expected printability, and said bands are compared to said catastrophic error metric in said step of identifying a violation.

17. A computer program product comprising a computer usable medium having computer readable program embodied in said medium for verifying a lithographic mask, wherein the computer readable program when executed on a computer causes the computer to:
   provide a mask layout;
   provide a catastrophic error metric;
   provide a plurality of image models, wherein said plurality of image models comprises a plurality of kernels ranked according to decreasing image contribution;
   simulate an image for said mask layout using at least one of said plurality of image models comprising a first subset of said plurality of kernels;
   identify a violation of said catastrophic error metric in said simulated image;
   identify a portion of said mask layout corresponding to said simulated image that includes said violation; and
   simulate a next image for said portion of said mask layout using a next of said plurality of image models comprising a second subset of said plurality of kernels comprising said first subset of said plurality of kernels and at least an additional one of said plurality of kernels having less image contribution than said kernels of said first subset.

18. The computer program product of claim 17 further comprising repeating said steps of identifying a violation of said catastrophic error metric in said simulated image, identifying a portion of said mask layout corresponding to said simulated image that includes said violation, and simulating a next image for said portion of said mask layout, wherein each step of simulating a next image uses a next of said plurality of image models having greater accuracy than said at least one image model used in the prior step of simulating, until said violation is identified for said simulation image using a maximally accurate of said plurality of image models.

19. The computer program product of claim 18 further comprising providing identifying a plurality of violations of said catastrophic error metric in said simulated image, and identifying a plurality of portions of said mask layout corresponding to portions of said simulated image comprising said plurality of violations, and simulating a next image for said plurality of portions of said mask layout.

20. The computer program product of claim 19 further comprising identifying a portion of said next simulated image wherein no violations of said catastrophic error metric occur and removing said corresponding portion of said plurality of portions of said mask layout from further simulation steps.

21. The computer program product of claim 17 wherein said plurality of image models comprises a SOCS model.

22. The computer program product of claim 17 wherein said plurality of image models comprises a resist model.

23. The computer program product of claim 22 wherein said resist model comprises a polynomial.

24. The computer program product of claim 23 wherein said polynomial comprises a class 1 polynomial.

25. The computer program product of claim 23 wherein said polynomial comprises a class 2 polynomial.

26. The computer program product of claim 17, wherein said plurality of image models comprises a class 1 polynomial and a class 2 polynomial, and wherein said step of simulating an image comprises using said class 2 polynomial, and wherein said step of simulating a next image comprises using said class 1 polynomial.

27. The computer program product of claim 17 wherein said violation is selected from the group consisting of a bridging error, a side-lobe printing error, an SRAF printing error, a necking error and a line-end shortening overlay error.

28. The computer program product of claim 17 wherein said violation comprises an excessive light error, and said simulation comprises a bright field simulation.

29. The computer program product of claim 28 wherein said violation is selected from the group consisting of a bridging error, a side-lobe printing error and an SRAF printing error.

30. The computer program product of claim 17 wherein said violation comprises an insufficient light error, and said simulation comprises a dark field simulation.

31. The computer program product of claim 30 wherein said violation is selected from the group consisting of a necking error and a line-end shortening overlay error.

32. The method of claim 17 wherein said simulated images comprises bands of expected printability, and said bands are compared to said catastrophic error metric in said step of identifying a violation.

* * * * *